(12) United States Patent
Pattanayak et al.

(10) Patent No.: US 7,557,409 B2
(45) Date of Patent: Jul. 7, 2009

(54) SUPER TRENCH MOSFET INCLUDING BURIED SOURCE ELECTRODE

(75) Inventors: Deva N. Pattanayak, Saratoga, CA (US); Yuming Bai, Union City, CA (US); Kyle Terrill, Santa Clara, CA (US); Christiana Yue, Milpitas, CA (US); Robert Xu, Fremont, CA (US); Kam Hong Lui, Santa Clara, CA (US); Kuo-In Chen, Los Altos, CA (US); Sharon Shi, San Jose, CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 11/698,519

(22) Filed: Jan. 26, 2007

(65) Prior Publication Data

US 2007/0187753 A1    Aug. 16, 2007

Related U.S. Application Data

(62) Division of application No. 10/836,833, filed on Apr. 30, 2004, now Pat. No. 7,183,610.

(51) Int. Cl.
    *H01L 29/76*    (2006.01)
(52) U.S. Cl. .............................. 257/333; 257/E29.027; 257/E29.262
(58) Field of Classification Search ................. 257/333, 257/E29.027, E29.128, E29.133, E29.136, 257/E29.262
    See application file for complete search history.

(56) References Cited

U.S. PATENT DOCUMENTS

| | | | |
|---|---|---|---|
| 4,914,058 A | 4/1990 | Blanchard | 438/203 |
| 5,072,266 A * | 12/1991 | Bulucea et al. | 257/330 |
| 5,216,275 A | 6/1993 | Chen | 257/493 |
| 5,233,215 A | 8/1993 | Baliga | 257/490 |

(Continued)

FOREIGN PATENT DOCUMENTS

DE    10234996 A1  *  10/2003

(Continued)

OTHER PUBLICATIONS

Xin Yang et al. "Tunable Oxide-Bypassed Trench Gate MOSFET: Breaking the Ideal Superjunction MOSFET Performance Line at Equal Column Width", IEEE Electron Device Letters, vol. 24, No. 11, Nov. 2003, pp. 704-706.

*Primary Examiner*—Thomas L Dickey
(74) *Attorney, Agent, or Firm*—Patentability Associates

(57) ABSTRACT

In a trench MOSFET, the lower portion of the trench contains a buried source electrode, which is insulated from the epitaxial layer and semiconductor substrate but in electrical contact with the source region. When the MOSFET is in an "off" condition, the bias of the buried source electrode causes the "drift" region of the mesa to become depleted, enhancing the ability of the MOSFET to block current. The doping concentration of the drift region can therefore be increased, reducing the on-resistance of the MOSFET. The buried source electrode also reduces the gate-to-drain capacitance of the MOSFET, improving the ability of the MOSFET to operate at high frequencies. The substrate may advantageously include a plurality of annular trenches separated by annular mesas and a gate metal layer that extends outward from a central region in a plurality of gate metal legs separated by source metal regions.

2 Claims, 26 Drawing Sheets

U.S. PATENT DOCUMENTS

| | | | | |
|---|---|---|---|---|
| 5,365,102 | A | 11/1994 | Mehrotra et al. | 257/475 |
| 5,438,215 | A | 8/1995 | Tihanyi | 257/401 |
| 5,607,875 | A * | 3/1997 | Nishizawa et al. | 438/404 |
| 5,637,898 | A | 6/1997 | Baliga | 257/330 |
| 5,689,128 | A * | 11/1997 | Hshieh et al. | 257/331 |
| 5,700,712 | A * | 12/1997 | Schwalke | 438/430 |
| 5,917,216 | A | 6/1999 | Floyd et al. | 257/330 |
| 5,998,833 | A | 12/1999 | Baliga | 257/329 |
| 6,137,136 | A | 10/2000 | Yahata et al. | 257/331 |
| 6,191,447 | B1 * | 2/2001 | Baliga | 257/330 |
| 6,388,286 | B1 | 5/2002 | Baliga | 257/330 |
| 6,525,372 | B2 | 2/2003 | Baliga | 257/328 |
| 6,534,836 | B1 * | 3/2003 | Osanai | 257/401 |
| 6,545,316 | B1 | 4/2003 | Baliga | 257/329 |
| 6,853,033 | B2 * | 2/2005 | Liang et al. | 257/339 |
| 2002/0030237 | A1 * | 3/2002 | Omura et al. | 257/397 |
| 2002/0036319 | A1 * | 3/2002 | Baliga | 257/328 |
| 2003/0001203 | A1 * | 1/2003 | Ono et al. | 257/330 |
| 2003/0006456 | A1 | 1/2003 | Takahashi et al. | 257/330 |
| 2003/0049930 | A1 * | 3/2003 | Disney | 438/637 |
| 2003/0080378 | A1 * | 5/2003 | Zundel et al. | 257/330 |
| 2004/0031987 | A1 * | 2/2004 | Henninger et al. | 257/328 |

FOREIGN PATENT DOCUMENTS

| | | |
|---|---|---|
| EP | 0 053 854 A1 | 11/1981 |
| EP | 1 168 455 | 1/2002 |
| WO | WO 01/08226 | 2/2001 |

* cited by examiner

US 7,557,409 B2

SUPER TRENCH MOSFET INCLUDING BURIED SOURCE ELECTRODE

This application is a divisional of application Ser. No. 10/836,833, filed Apr. 30, 2004 now U.S. Pat. No. 7,183,610, which is incorporated herein by reference in its entirety.

FIELD OF THE INVENTION

This invention relates to semiconductor devices that include a gate electrode formed in a trench, and in particular to trench-gated metal-oxide-silicon field-effect transistors (MOSFETs) and diodes.

BACKGROUND OF THE INVENTION

Power MOSFETs are the preferred switching devices for notebook computers and other portable electronic devices, and they are also widely used for switching currents in the automotive industry. In a common form of MOSFET, the gate electrode is formed in a trench that extends downward from the surface of the chip, and current flows primarily in a vertical direction between a source region on one surface of the chip and a drain region on the other surface of the chip. The source region is normally shown on the top surface of the chip and the drain region is shown on the bottom surface of the chip, although this orientation is arbitrary. The trench is lined with a dielectric layer (typically silicon dioxide), and a channel is formed in a body region adjacent a wall of the trench. When the gate is properly biased (positive in an enhancement-mode N-channel device, negative in an enhancement-mode P-channel device) the channel becomes inverted and allows current to flow between the source and the drain. In depletion-mode devices the MOSFET is normally turned on and is turned off by a proper gate bias (negative in a depletion-mode N-channel device, positive in a depletion-mode P-channel device).

Two of the principal performance criteria of a power MOSFET are its on-resistance ($R_{dson}$) and its avalanche breakdown voltage $V_B$. $R_{dson}$ is a measure of the resistance through the MOSFET when it is turned on and $V_B$ is a measure of its ability to block a reverse voltage. Another important performance criterion is the capacitance between the gate and drain ($C_{gd}$), which determines the MOSFET's ability to switch current quickly and operate at high frequencies. In normal trench-gated MOSFETs the gate-to-drain capacitance is measured across the gate oxide layer at the bottom of the trench, which separates the gate electrode from the drain.

It is known to increase the breakdown voltage $V_B$ by including a "drift region" between the body and the drain of the device. The drift region is a relatively lightly-doped region of the same conductivity type as the drain. While the inclusion of a drift region in the device tends to improve $V_B$, it also tends to increase $R_{dson}$, since the drift region represents a relatively lightly-doped region that the current must traverse when the MOSFET is turned on.

Various techniques have been proposed for reducing $C_{gd}$. One proposal, suggested in U.S. Pat. No. 4,914,058 to Blanchard, is to increase the thickness of the gate oxide layer at the bottom of the trench. This technique is illustrated by MOSFET 10, shown in the cross-sectional view of FIG. 1. MOSFET 10 is formed in an epitaxial (epi) layer 102 that is grown on an N+ substrate 100. A trench 104 extends through epi layer 102 and into N+ substrate 100. Since MOSFET 10 is an N-channel device, epi layer 102 is generally doped with an N-type impurity such as phosphorus. Epi layer 102 also includes an N+ source region 106 and a P body 108, both of which are contacted by a metal layer 115. The background N-type doping of epi layer 102 is found in an N-drift region 110. N+ substrate 100 and N-drift region 110 represent the drain of MOSFET 10.

The sidewalls of trench 104 are lined with a gate oxide layer 112, and trench 104 is filled with a gate electrode 114, which is typically made of polycrystalline silicon. (polysilicon) that is doped heavily to make it conductive. At the bottom of trench 104 is a thick oxide layer 116 that serves to reduce the capacitance between the polysilicon gate 114 and the drain (N+ substrate 100 and N-drift region 110). The $R_{dson}$ of MOSFET 10 can be reduced somewhat by providing a graded doping concentration in N-drift region 100, decreasing gradually in the direction from N+ substrate 100 to P body 108, but nonetheless $R_{dson}$ is still not below the silicon limit which is the minimum $R_{dson}$ for a given breakdown voltage BV. The silicon limit is defined by the equation, $R_{dson}=5.93 \times 10^{-9} *BV^{2.5}$.

A two-step etching process was described for fabricating this device. First, a gate trench mask was used to form trenches of a desired width and depth. A thin gate oxide was grown on the walls and floor of trench 104, and a nitride layer was deposited over the gate oxide layer. A directional etching process (e.g., reactive ion etching (RIE)) was used to remove the nitride and gate oxide from the floor of the trench, and a second trench was etched through the floor of the trench reaching to the N+ substrate 100. Thick oxide layer 116 was formed in the second trench. The other process steps were similar to those customarily employed in trench MOSFET fabrication.

U.S. Pat. No. 5,637,898 to Baliga describes a process that uses a single-trench etch and an oxidation that creates a thick bottom oxide. Polysilicon is subsequently deposited and etched, leaving a recessed polysilicon layer at the bottom of the trench. The sidewall oxide is then etched away, and a new gate oxide layer is grown, followed by a selective RIE process to remove the oxide layer formed on top of the recessed polysilicon layer. Polysilicon is then deposited to form the desired thin-thick gate oxide layer realized by Blanchard in the two-step etch process described above. Baliga also uses a graded doping profile in the drift region to reduce the on-resistance.

U.S. Pat. No. 5,998,833 to Baliga teaches another type of trench MOSFET. The trench contains an upper gate electrode, which is generally aligned with the source and base regions, and a lower source electrode, which is generally aligned with the drift region. Again, the drift region is linearly graded and decreases in a direction from the drain region to the surface of the silicon. However, the bottom of the upper gate electrode is aligned with the junction between the P-base region and the N-drift region. This requires that both the polysilicon layer that is deposited to form the lower source electrode be etched and the oxide layer separating the upper and lower electrodes be formed to a high degree of accuracy. If, for example, the lower source is not etched deeply enough, or if the oxide layer separating the upper and lower electrodes is grown too thick, the bottom of the gate electrode will be located above the junction between the base and drift regions. As a result, the upper gate electrode will not invert the entire channel and the device will not turn on. U.S. Pat. No. 6,388,286 to Baliga describes a trench structure that has similar problems.

Recently, an article by X. Yang et al. ("Tunable Oxide-Bypassed Trench Gate MOSFET: Breaking the Ideal Super-junction MOSFET Performance Line at Equal Column Width," IEEE Electron Device Letters, Vol. 24, No. 11, pp. 704-706, 2003) described a trench oxide bypass structure that had very low $R_{dson}$. Drawing on a concept previously proposed by Y. C. Liang et al. ("Tunable oxide-bypassed VDMOS (OBVDMOS): Breaking the silicon limit for the second generation," Proc. IEEE/ISPSD, pp. 201-204, 2002), this article reported the successful fabrication of a TOB-UMOS device having a 79 V rating. The device reportedly broke the ideal superjunction MOSFET performance line at an equal column width of 3.5 µm and potentially the ideal silicon limit as well.

Nonetheless, there is a clear need for a new type of MOSFET whose on-resistance is lower than what can be achieved following conventional MOSFET structures.

SUMMARY OF THE INVENTION

In a trench MOSFET according to this invention, the trench has an upper portion, which includes a gate electrode, and a lower portion, which includes a buried source electrode. The gate electrode is isolated from the body region by a gate dielectric layer, which is typically an oxide layer. The buried source electrode is isolated from the drift region by a second dielectric layer and from the gate electrode by a third dielectric layer, both of which are typically oxide layers. There is a vertical overlap between the buried source electrode and the gate electrode which provides a margin of error in the diffusion of the body region.

The buried source electrode is electrically connected to the source region. As a result, when the MOSFET is reverse-biased, the source electrode depletes the drift region in a direction transverse to the general direction of current flow. There is normally a similar trench on the opposite side of the drift region, so the drift region is depleted from both sides. This allows the doping concentration of the drift region to be significantly higher than it would otherwise need to be to block a reverse current flow between the drain and the source. Therefore, the resistivity of the drift region is far less when the device is turned on.

In addition, the buried source electrode separates the gate from the drain and thereby reduces the gate-to-drain capacitance, allowing the MOSFET to operate at high frequencies.

This structure is different from the structure proposed by X. Yang et al., supra, in that it does not suffer from the limitation relating to the width of the mesa. In the structure we propose, the unit cell is the sum of the trench MOSFET and the thick oxide buried source element. Our structure uses the silicon more effectively because we construct the trench MOSFET over the buried source.

According to another aspect of the invention, a MOSFET is fabricated by a process which includes: forming a trench at a first surface of a semiconductor substrate, the substrate including dopant of a first conductivity type; depositing a mask layer over the first surface, the mask layer lining the walls and floor of the trench; removing a portion of the mask layer adjacent the floor of the trench, remaining portions of the mask layer remaining attached to sidewalls of the trench; etching the substrate through the bottom of the trench with the remaining portions of the mask layer remaining attached to sidewalls of the trench so as to form a cavity in the substrate; heating the substrate with the remaining portions of the mask layer remaining attached to sidewalls of the trench so as to form a first dielectric layer in the cavity; removing the remaining portions of the mask layer; introducing conductive material into the cavity, the conductive material being separated from said substrate by the first dielectric layer; heating the substrate so as form a second dielectric layer at an exposed surface of the conductive material and a gate dielectric layer along walls of the trench; introducing conductive material into the trench; forming a body region of a second conductivity type opposite to the first conductivity type in the substrate, the body region abutting the gate dielectric layer; forming a source region of the first conductivity type abutting the gate oxide layer and forming a junction with the body region; covering the conductive material in the trench with a third dielectric layer; and depositing a metal layer over the substrate, the metal layer being in electrical contact with the source region.

Preferably, the device is laid out in a pattern of annular mesas and trenches. Contact to the gate electrodes can be made by an array of gate metal legs that extend outward from a central region of the die. The die can be made "self-terminating" by making a peripheral trench deeper than the remaining trenches and contacting the peripheral trench with the source metal layer.

DESCRIPTION OF THE INVENTION

Figure 2:
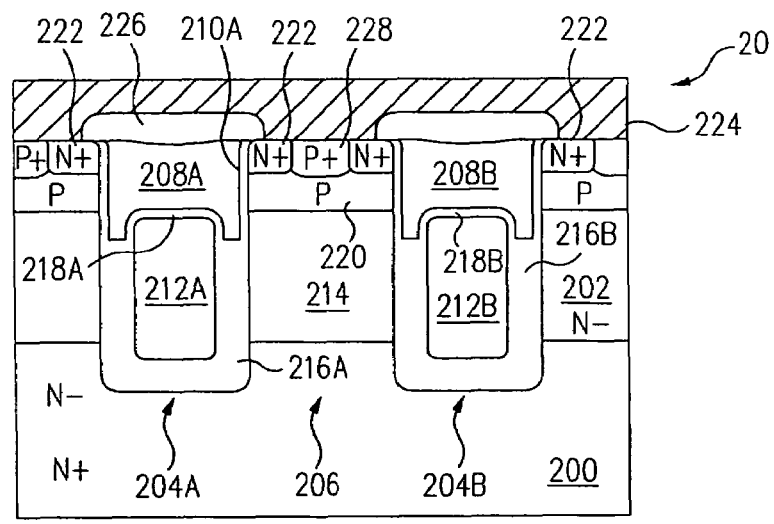
FIG. 2 is a cross-sectional view of a MOSFET according to the invention.

FIG. 2 illustrates a cross-sectional view of an N-channel MOSFET 20 in accordance with this invention. MOSFET 20 is formed in an epitaxial (epi) layer 202 that is grown on an N+ substrate 200. Trenches 204A and 204B and are formed in epi layer 202. Trenches 204A and 204B are separated by a mesa 206. While FIG. 2 shows only two trenches, it will be understood by those of skill in the art that the trenches and mesas shown in FIG. 2 typically represent only a tiny fraction of the total number of trenches and mesas in the actual device, which may number in the millions. The trenches and mesas may be arranged in a variety of geometric patterns on the surface of epi layer 202. In some of the most common of these patterns, the mesas are hexagons, squares or longitudinal stripes and are separated by trenches of uniform width and depth. As trenches 204A and 204B are identical, only trench 204A will be described in detail. It will be understood that the structure of trench 204B is identical to the structure of trench 204A, with the similarly numbered components being identical.

The upper portion of trench 204A includes a polysilicon gate 208A that is separated from mesa 206 by a gate oxide layer 210A, which lines the sidewalls of the upper portion of trench 204A. The lower portion of trench 204A includes a buried source electrode 212A, which is electrically isolated from N-drift region 214 by a thick oxide layer 216A and from gate 208A by a thin oxide layer 218A. As described below, buried source electrode 212A is electrically connected to N+ source region 222 and P-body region 220 in the third dimension, outside the plane of FIG. 2. In this embodiment, buried source electrode 212A is formed of doped polysilicon. Thick oxide layer 216A lines the sidewalls and bottom of the lower portion of trench 204A.

The upper portion of mesa 206 includes a P-body region 220 and an N+ source region 222. The lower junction of P-body region 220 abuts N-drift region 214. The drain of MOSFET 20 includes N+ substrate 200 and N-drift region 214.

Overlying epi layer 202 is a source metal layer 224, which contacts N+ source region 222 and P-body region 220. A P+ region 228 provides an ohmic contact between metal layer 224 and P-body region 220. Gate 208A is insulated from source metal layer 224 by a borophosphosilicate glass (BPSG) layer 226.

Gate oxide layer 210A has a thickness that is selected to provide the desired threshold voltage $V_{th}$ for MOSFET 20. Thick oxide layer 216A has a thickness that can withstand the maximum drain-to-source breakdown voltage without rupture or damage.

Figure 3:
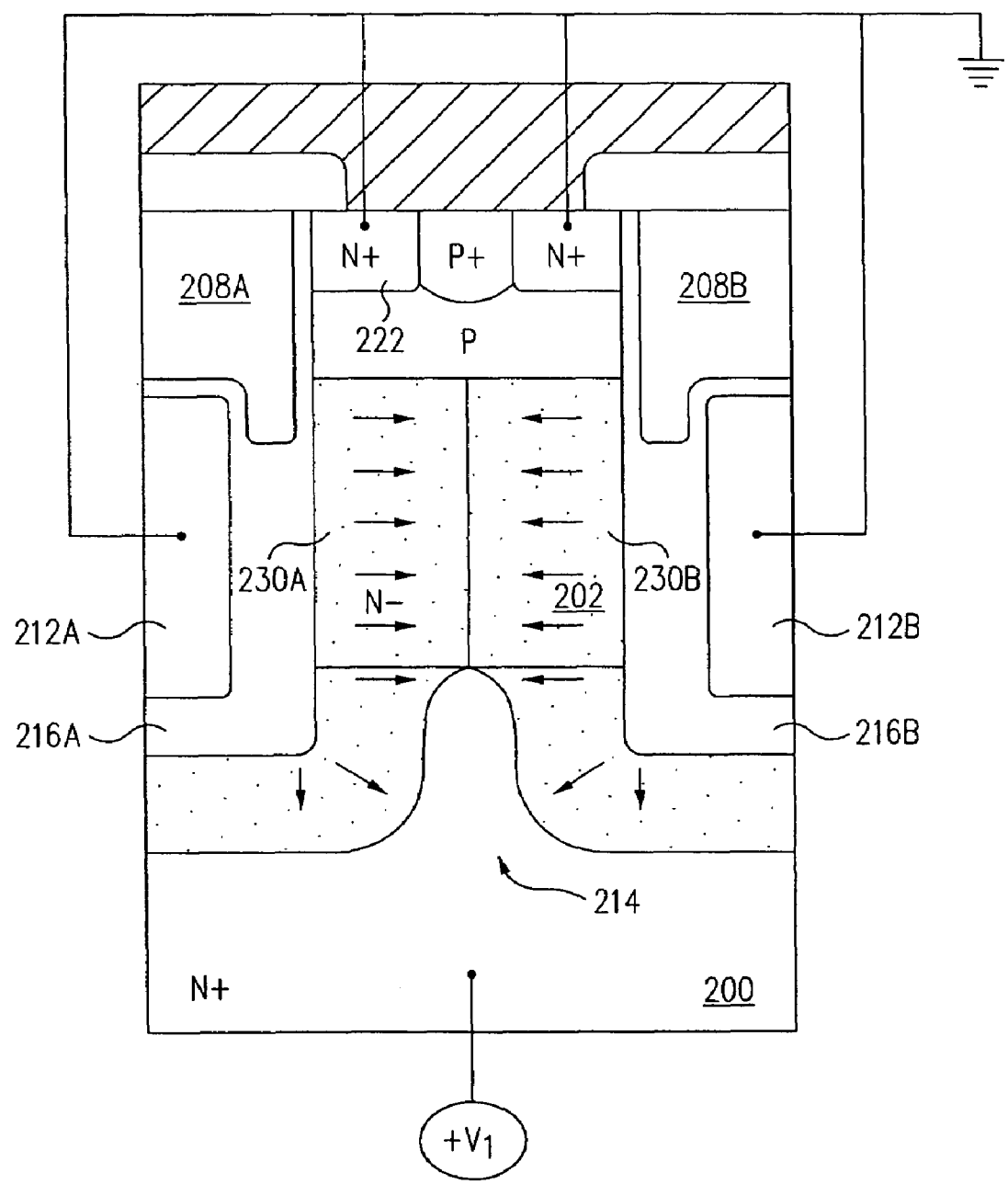
FIG. 3 is a schematic view of the MOSFET of FIG. 2 showing the expansion of the depletion regions that occurs when the device is turned off.

Since the buried source electrodes 212A, 212B are tied to the N+ source region 222, the full source-to-drain voltage is seen across thick oxide layer 216A when MOSFET 20 is turned off. The doping concentration of N-drift region 214 is selected such that N-drift region 214 is fully depleted when the maximum drain-to-source voltage is reached. This is illustrated in FIG. 3, a detailed view of N-drift region 214, wherein the N+ substrate (drain) is shown schematically as biased to a positive voltage V1 and the N+ source region 222 and buried source electrodes 212A and 212A are shown schematically as grounded. As indicated, depletion regions 230A and 230B spread laterally inward from the thick oxide layers 216A, 216B on both sides of N-drift region 214 until the depletion regions 230A, 230B meet at the center of N-drift region 214.

This formation of depletion regions 230A, 230B allows the doping concentration of N-drift region 214 to be higher than it would otherwise be, thereby reducing the $R_{dson}$ of MOSFET 20.

Figure 8:
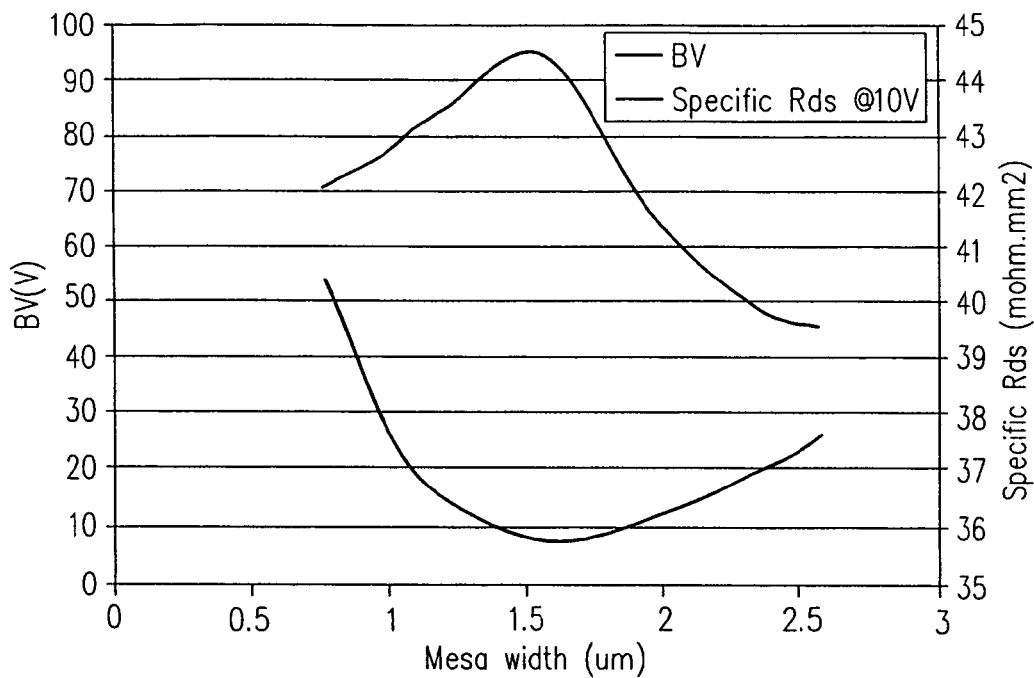
FIG. 8 is a graph generated by computer simulation showing the variation of the specific on-resistance and breakdown voltage of a MOSFET according to this invention as a function of the width of the mesa.

Computer simulation, using such widely available programs as MEDICI and SUPREM-4, shows that by the properly choice of the mesa width and doping the $R_{dson}$ can be made lower than the value can be attained in conventional silicon trench MOSFET. FIG. 8 is a computer-generated graph which shows the variation of the specific on-resistance and breakdown voltage as a function of mesa width for a device having a doping concentration on the order of $3\times10^{16}$ cm$^{-3}$. The mesa width varied from zero up to 3 µm. At a mesa width of approximately 1.5 µm the specific on-resistance ($R_{dson}$) reaches a minimum value of less than 36 mohm-mm$^2$ and the breakdown voltage BV reaches a maximum of approximately 95 V. This may be compared with the ideal silicon limit of 65 mohm-mm$^2$ referenced in the above X. Yang et al. article.

This structure will yield $R_{dson}$ values below that which can be achieved with conventional trench structures. This is the reason why we have coined the title super Trench MOSFET. Those of skill in the art will understand that better results can be obtained by optimizing the device parameters. Also, the structure is not limited to any particular voltage range.

Table 1 below provides several parameters that may be used to achieve breakdown voltages in the range of 60 to 250 V. The parameters can be varied somewhat (e.g., ±20%) and still achieve satisfactory results:

TABLE 1

|  | BV | | | | | |
| --- | --- | --- | --- | --- | --- | --- |
|  | 60 | 90 | 100 | 150 | 200 | 250 |
| Oxide Thickness (µm) | 0.3 | 0.55 | 0.6 | 1.0 | 1.6 | 2.2 |
| Trench Width (µm) | 0.8 | 1.3 | 1.4 | 2.2 | 3.4 | 4.6 |
| Drift Doping Conc. (cm$^{-3}$) | 5.1e16 | 2.7e16 | 2.0e16 | 1.1e16 | 7.5e16 | 4.5e15 |
| Mesa Width (µm) | 1.0 | 1.4 | 2.0 | 2.9 | 3.1 | 4.4 |
| $R_{dson}$ (mohm-mm$^2$) | 12.9 | 33.8 | 42.9 | 82.1 | 154.3 | 283.3 |
| $R_{dson}$ Silicon Limit (mohm-mm$^2$) | 13.0 | 44.8 | 58.7 | 174 | 373 | 629s |

It is important to note that buried source electrode 212A also shields gates 208A, 208B from the drain (N+ substrate 200 and N-drift region 214) thereby reducing the gate-to-drain capacitance to near zero. The thickness of oxide layers 218A and 218B is selected in light of the desired gate-to-source capacitance between gate 208A and buried source electrode 212A. The gate-to-source capacitance is equal to $Wp*W*\epsilon ox/tox$, where Wp is the perimeter of the gate 208A and W is the width of the gate 208A. Increasing oxide thickness will reduce gate-to-source capacitance.

Figure 4A:
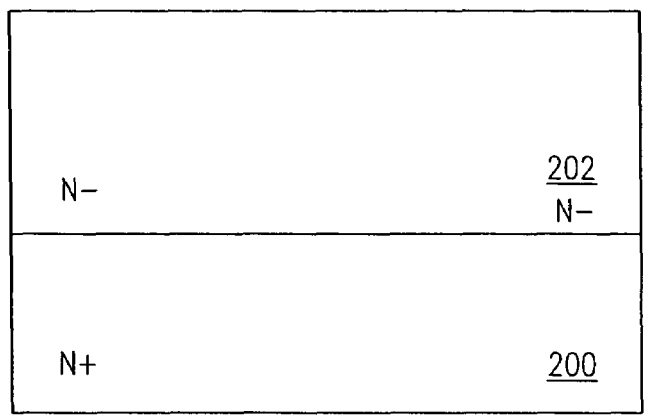
FIGS. 4A-4L illustrate steps of a process that can be used to fabricate the MOSFET shown in FIG. 2.

FIGS. 4A-4L illustrate several steps of a process that may be used to fabricate MOSFET 20. As shown in FIG. 4A, the process begins by growing N-epitaxial (epi) layer 202 on substrate 200. Substrate 200 is heavily doped with N-type impurity to a resistivity in the range of 1 to 3 mohm-cm, and epi layer 202 is doped with an N-type impurity such as phosphorus to a doping concentration in the range of $2.5\times10^{16}$ cm$^{-3}$ to $3.5\times10^{16}$ cm$^{-3}$, preferably about $3\times10^{16}$ cm$^{-3}$ for a device with 80 V breakdown voltage. The doping concentration of epi layer 202 may be substantially uniform.

Figure 4B:
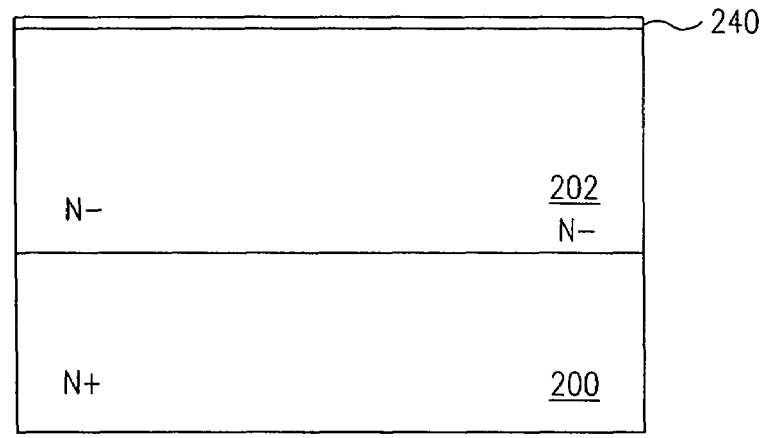

Next, as shown in FIG. 4B, a pad oxide layer 240 is thermally grown in the top surface of N-epi layer 202. Oxide layer 240 can have a thickness of 5000 Å, for example for a 80V breakdown device, so that the maximum field supported by the thick oxide is below that of the oxide breakdown field.

Figure 4C:
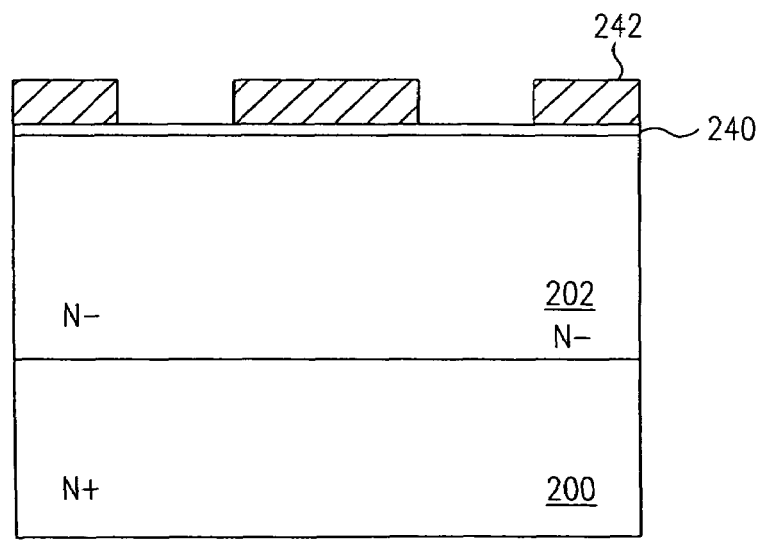

As shown in FIG. 4C, a photoresist mask layer 242 is formed over oxide layer 240, and mask layer 242 is photolithographically patterned with openings where the trenches are to be located.

Figure 4D:
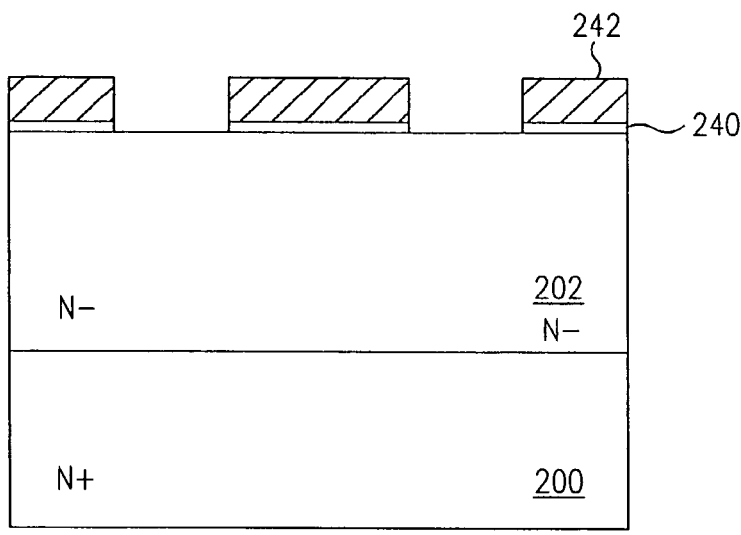

As shown in FIG. 4D, oxide layer 240 is then etched through the openings in mask layer 242 to form openings which expose the top surface of epi layer 202. Mask layer 242 may then be removed.

Figure 4E:
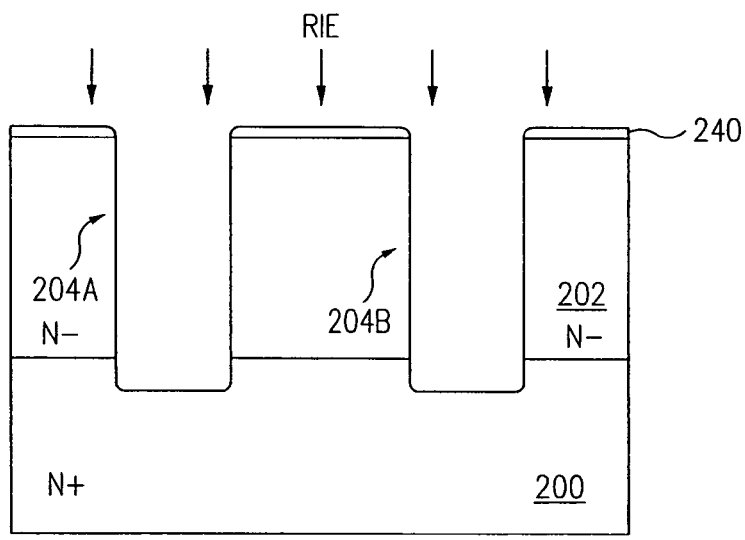

As shown in FIG. 4E, trenches 204A and 204B are formed by directionally etching epi layer 202 through the openings in oxide layer 240, preferably using a reactive ion etch (RIE) process. In the embodiment shown, trenches 204A and 204B extend into epi layer 202 but not all the way to N+ substrate 200. Pad oxide layer 240 is then-removed, using a buffered oxide wet etch.

Figure 4F:
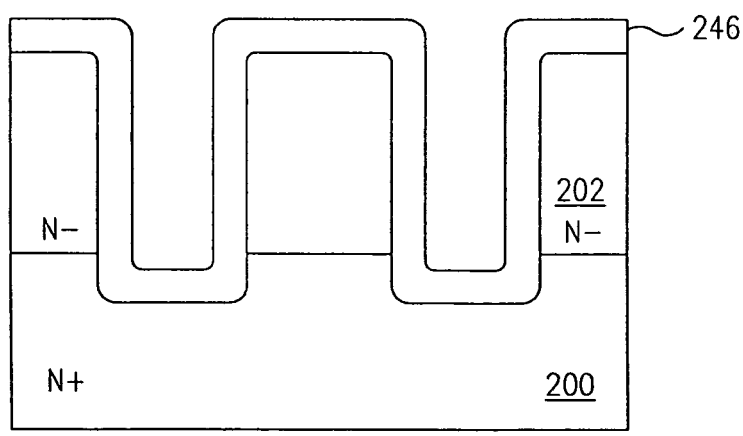

As shown in FIG. 4F, a second, thick silicon oxide layer 246 is thermally grown over the top surface of N-epi layer 202, for example, by heating epi layer 202 to 1100° C. for 40 minutes. For example, oxide layer 246 could be 5000 Å thick. As shown, oxide layer 246 conforms to the contours of the trenches 204A and 204B.

Figure 4G:
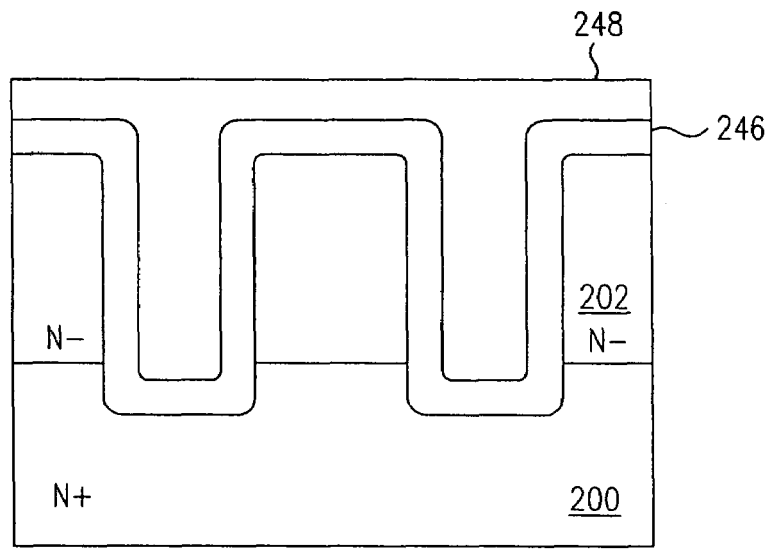

As shown in FIG. 4G, a conductive polysilicon layer 248 is deposited over the top surface of the structure, filling trenches 204A and 204B and overflowing the entire surface of oxide layer 246. Polysilicon layer 248 can be doped with an N-type impurity such as phosphorus to a concentration of $\_10^{21}$ cm$^{-3}$.

Figure 4H:
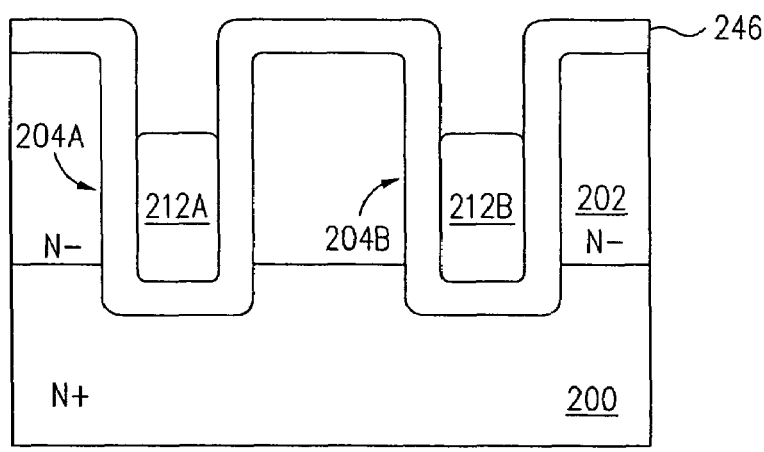

As shown in FIG. 4H, polysilicon layer 248 is etched back until the surface of polysilicon layer 248 is located within trenches 204A and 204B, thereby forming buried source electrodes 212A and 212B in trenches 204A and 204B, respectively, which are electrically isolated from epi layer 202 by oxide layer 246. This is done using a process that does not significantly attack oxide layer 246. The polysilicon etches faster than silicon dioxide, and the silicon dioxide layer 246 is made thick enough that there is a remaining layer of oxide left at the surface when the polysilicon layer 212A and 212B are etched inside the trenches. For reasons that are described below, to provide a contact with the buried silicon electrodes 212A and 212B, this etching process is preferably performed in two stages, with the surface of polysilicon layer 248 being approximately level with the surface of epi layer 202 following the first stage of etching. Polysilicon layer 248 is then etched again (except at the locations where the buried source electrodes are to be contacted) until the surface of polysilicon layer 248 reaches a final location. The final location of the surface of buried source electrodes is a matter of design, but in one embodiment it is located at a position corresponding to about one-sixth of the depth of trenches 204A and 204B.

Figure 4I:
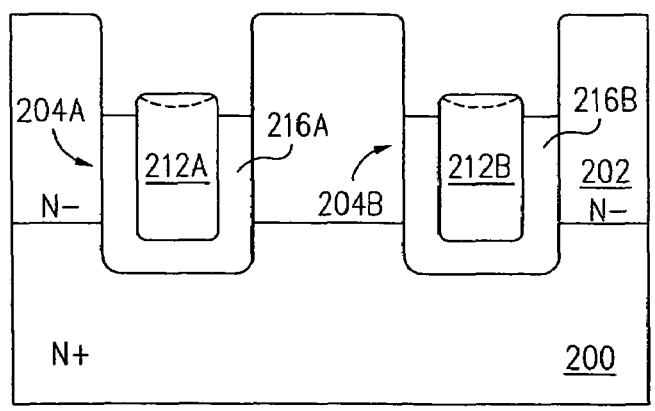
Figure 4J:
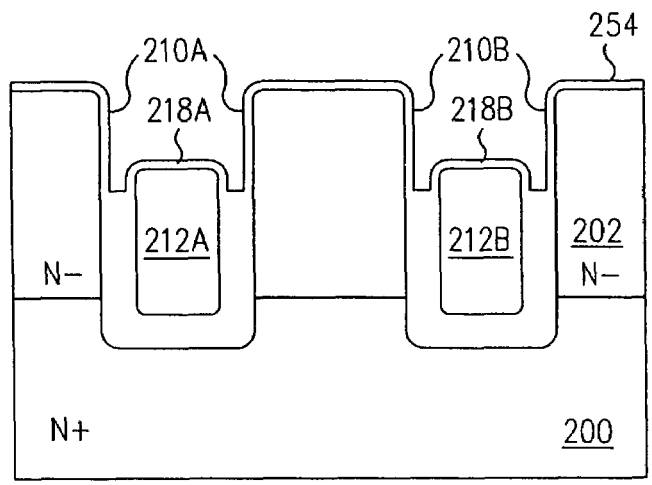

As shown in FIG. 4I, oxide layer 246 is etched until it is entirely removed form the top surface of epi layer 202 and the sidewalls of trenches 204A and 204B above polysilicon layer 248, leaving thick oxide layers 216A and 216B in the lower portions of trenches 204A and 204B, respectively. Preferably, when the etch of oxide layer 246 has been completed, the surface of oxide layers 216A and 216B is located slightly (e.g., 2000 Å) below the top surfaces of buried source electrodes 212A and 212B. As described below, this provides a vertical overlap between buried source electrodes 212A and 212B and polysilicon gates 208A and 208B. Next, a sacrificial oxide layer (not shown) can be grown on and removed from the sidewalls of trenches 204A and 204B to repair any crystal damage resulting from the earlier RIE process. Thereafter, as shown in FIG. 4J, the structure is annealed to form an oxide layer on the exposed silicon and polysilicon surfaces. This produces gate oxide layers 210A and 210B on the sidewalls of the upper portions of trenches 204A and 204B and oxide layers 218A and 218B on the top surfaces of buried source electrodes 212A and 212B. In addition, an oxide layer 254 is formed on the top surface of epi layer 202.

Even if the etchant used on oxide layer 246 (FIG. 4I) is highly selective, it may nonetheless deform buried source electrodes 212A and 212B slightly, so as to form depressions in the top surfaces thereof, as shown by the dashed lines in FIG. 4I. These depressions may make it difficult to grow oxide layers 218A, 218B uniformly on the top surfaces of buried source electrodes 212A, 212B. This problem can be avoided by annealing the structure shown in FIG. 4I in a hydrogen atmosphere, e.g., for about 10 seconds at 1050° C. The anneal returns the top surfaces of buried source electrodes 212A, 212B to the rounded shape shown by the solid lines in FIG. 4I.

Figure 4K:
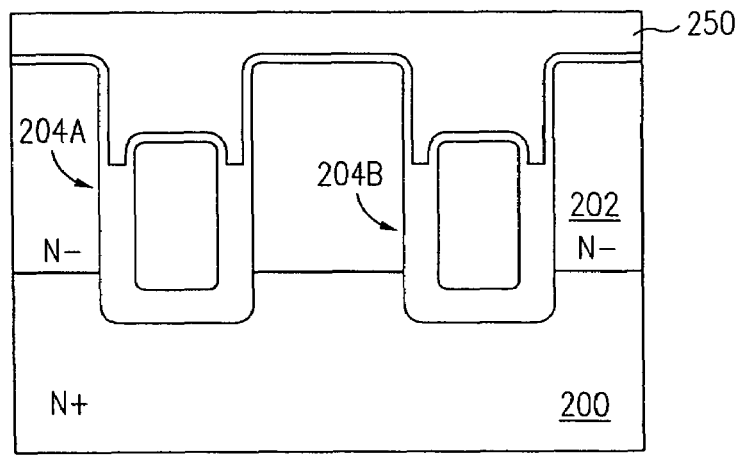

As shown in FIG. 4K, a second polysilicon layer 250 is deposited over the structure, filling the upper portions of trenches 204A and 204B and overflowing the top surface of epi layer 202. Polysilicon layer 250 can be doped with an N-type impurity such as phosphorus to a concentration of $10^{20}$ cm$^{-3}$.

Figure 4L:
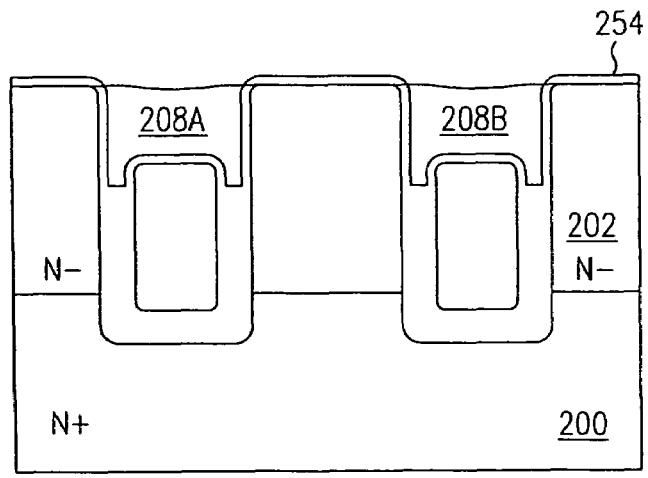

As shown in FIG. 4L, polysilicon layer 250 is etched back until its top surface is approximately level with the top surface of epi layer 202, thereby forming polysilicon gates 208A and 208B. As described above, the top surfaces of oxide layers 216A and 216B are recessed with respect to the top surface of buried source electrodes 212A and 212B, providing a vertical overlap between buried source electrodes 212A and 212B and gates 208A and 208B.

Thereafter, a P-type dopant such as boron with energy the order of 200 Kev and dose of $3\times10^{13}$ cm$^{-2}$ is implanted into epi layer 202 and driven in until it forms a junction with the remaining N-type region of epi layer 202 adjacent gate oxide layers 210A and 210B, thereby forming P-body region 220, shown in FIG. 2. The vertical overlap between buried source electrodes 212A and 212B and gates 208A and 208B provides a margin of error in this process, since the junction between P-body region 220 and N-drift region 214 must not be located adjacent thick oxide layers 216A and 216B. Otherwise, a portion of the channel will not be inverted when gates 208A and 208B are biased to turn the device on, and the device will not conduct current.

The top surface is appropriately masked, and an N-type dopant such as phosphorus is implanted to form N+ source regions 222. After another mask, a P-type implant with energy on the order of 80 Kev and dose of $8\times10^{15}$ cm$^{-2}$ is implanted to form P+ region 228. After oxide layer 254 has been removed by dry plasma etching, a layer of BPSG is deposited over the top surfaces of gates 208A and 208B and epi layer 202. A photoresist mask layer (not shown) is deposited and patterned over the BPSG layer, with an opening generally over mesa 206. The BPSG layer is etched through the opening to form BPSG layers 226 overlying gates 208A and 208B and extending over adjacent portions of the N+ source regions 222. Next, metal layer 224 is deposited to form contacts with the N+ source regions 222 and the P+ body contact region 228. The resulting structure is MOSFET 20, shown in FIG. 2.

As noted above, buried source electrodes 212A and 212B are electrically connected (i.e., shorted) to source regions 222. This connection can be made in a number of ways, and this invention is not limited to any particular technique. One way of making the connection between buried source electrodes 212A and 212B and source regions 222 will now be described, with reference to FIGS. 5A-5G.

FIGS. 5A-5G show a trench 204C which is connected to trenches 204A and 204B but is located where a connection to buried source electrodes 212A and 212B is to be made.

Figure 5A:
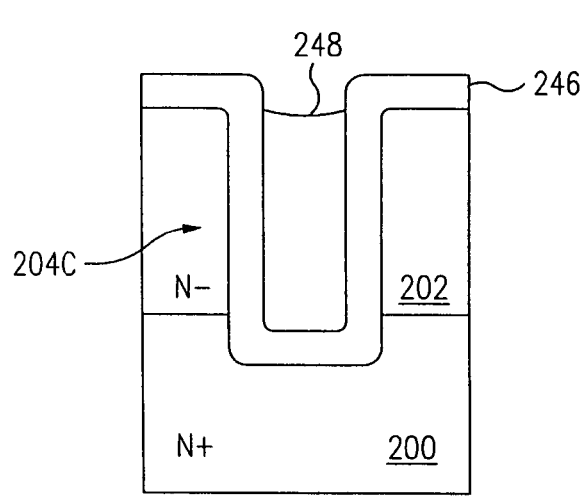
FIGS. 5A-5G illustrate steps of a process for making a connection between the buried source electrode and the source region in the MOSFET shown in FIG. 2.

As noted in the description of FIG. 4H, the etching of polysilicon layer 248 is preferably performed in two stages. At the completion of the first stage, polysilicon layer 248 appears as shown in FIG. 5A in trench 204C, with the surface of polysilicon layer 248 being approximately coplanar with the top surface of epi layer 202.

Figure 5B:
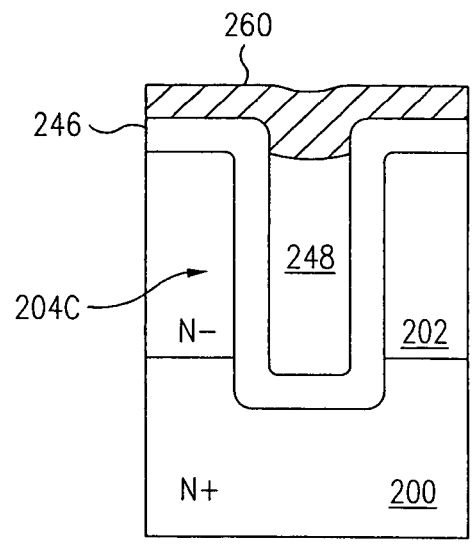

As shown in FIG. 5B, a photoresist mask layer 260 is deposited and photolithographically patterned to cover the location where the connection to buried source electrodes 212A and 212B is to be made. This segment of photoresist layer 260 remains in place during the second stage of the etching of polysilicon layer 248 and prevents further etching of polysilicon layer 248 at this location.

Figure 5C:
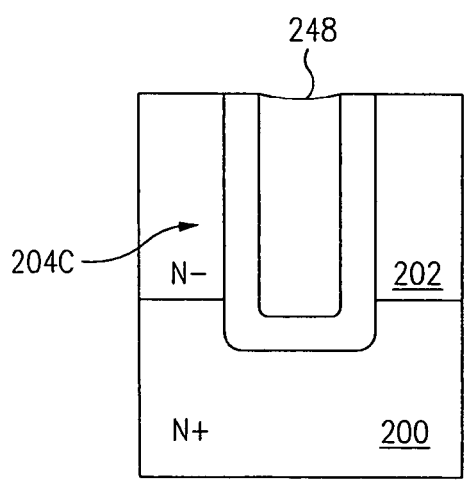

After polysilicon layer 248 as been etched a second time, as shown in FIG. 4H, photoresist layer 260 is removed. After oxide layer 246 has been etched, as shown in FIG. 4I, the structure appears as shown in FIG. 5C.

Figure 5D:
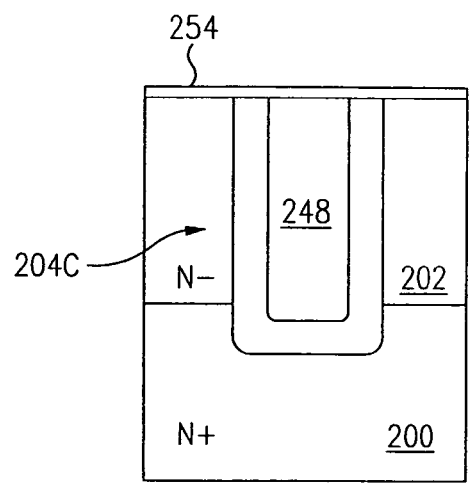

After oxide layer 254 has been grown (see FIG. 4J), the structure appears as shown in FIG. 5D. It remains in this state until P-body region 220, N+ source regions 222 and P+ body contact region 228 have been formed and BPSG layer 226 has been deposited.

Figure 5E:
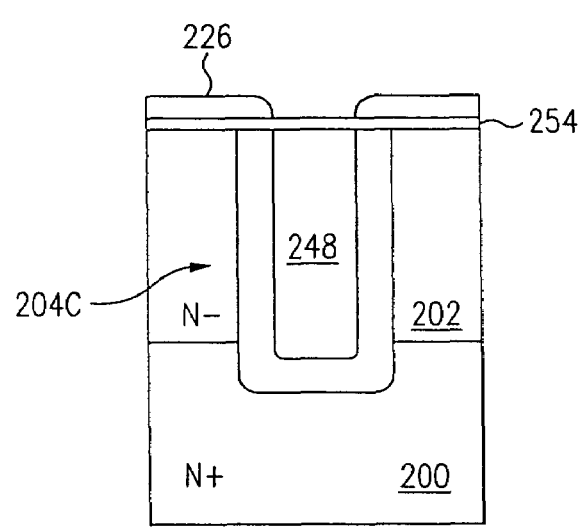

As shown in FIG. 5E, BPSG layer 226 is patterned with an opening 225 over polysilicon layer 248. This is done in the same process step which forms the openings over N+ source regions 222 and P+ body contact region 228.

Figure 5F:
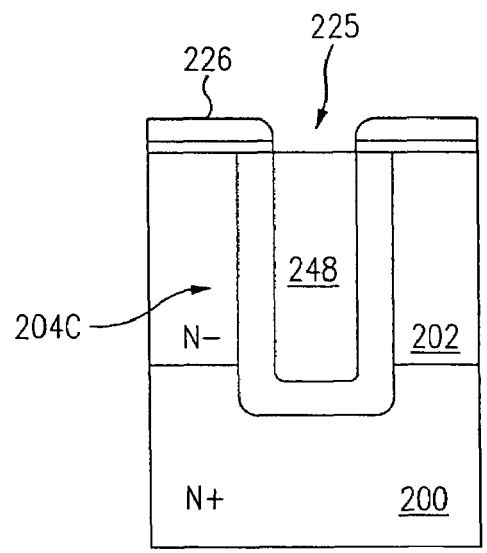

As shown in FIG. 5F, oxide layer 254 is etched through the opening in BPSG layer 226 to expose the top surface of polysilicon layer 248.

Figure 5G:
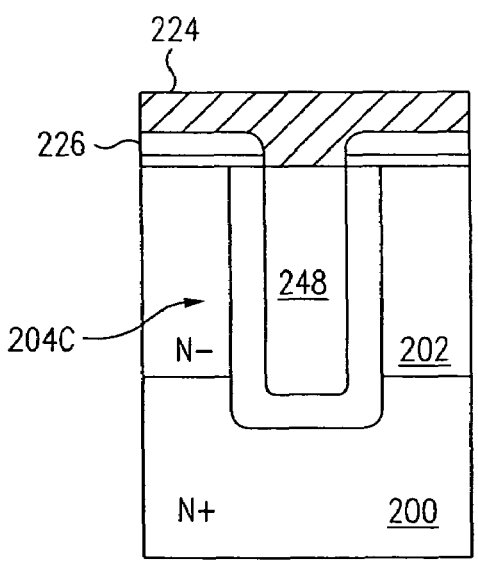

As shown in FIG. 5G, when source metal layer 224 is deposited, it contacts the top surface of polysilicon layer 248, thereby establishing an electrical contact between buried source regions 212A, 212B and N+ source regions 222.

Figure 6:
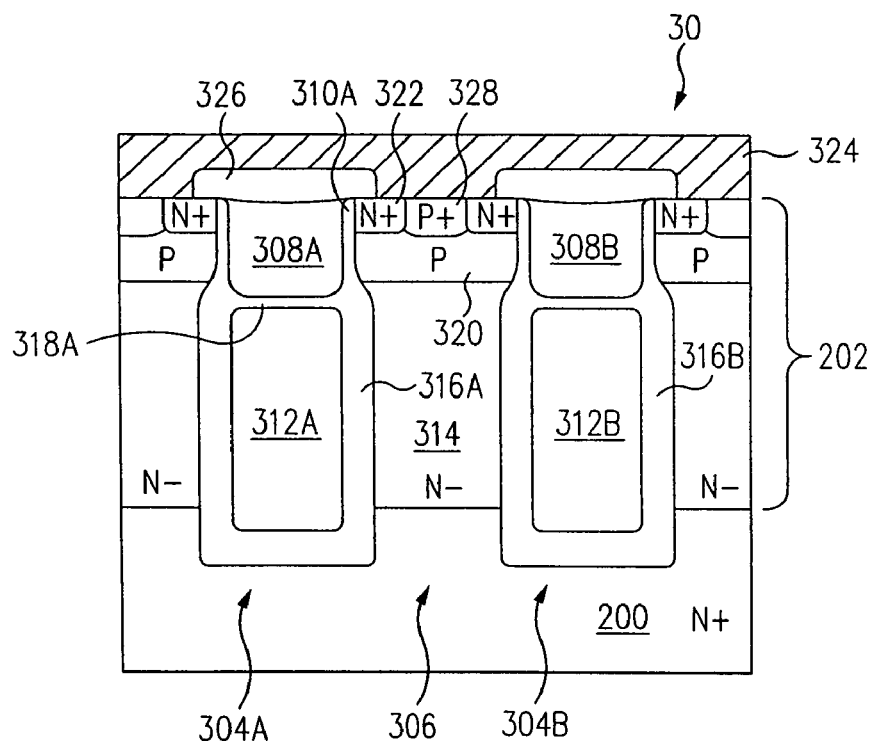
FIG. 6 is a cross-sectional view of an alternative MOSFET according to the invention.

FIG. 6 illustrates a cross-sectional view of an alternative MOSFET in accordance with this invention. N-channel MOSFET 30 is formed in epitaxial (epi) layer 202 that is grown on N+ substrate 200. Trenches 304A and 304B and are formed in epi layer 202. Trenches 304A and 304B are separated by a mesa 306. The components of trenches 304A and 304B are identical. Again, only trench 304A will be described.

The upper portion of trench 304A includes a polysilicon gate 308A that is separated from mesa 306 by a gate oxide layer 310A, which lines the sidewalls of the upper portion of trench 304A. The lower portion of trench 304A includes a buried source electrode 312A, which is separated from N-drift region 314 (in mesa 306) and from N+substrate 200 by a thick oxide layer 316A. Buried source electrode 312A is electrically connected to N+ source region 322 and P-body region 320 in the third dimension, outside the plane of FIG. 6. Thick oxide layer 316A lines the sidewalls and bottom of the lower portion of trench 304A. Buried source electrode 312A is separated from gate 308A by a thin oxide layer 318A.

The upper portion of mesa 306 includes a P-body region 320 and an N+ source region 322. The lower junction of P-body region 320 abuts N-drift region 314. The drain of MOSFET 30 includes N+ substrate 200 and N-drift region 314.

Overlying epi layer 202 is a source metal layer 324, which contacts N+ source region 322 and P-body region 320. A P+ region 328 provides an ohmic contact between metal layer 324 and P-body region 320. Gate 308A is insulated from source metal layer 224 by a BPSG layer 326.

As described above in connection with MOSFET 20, gate oxide layer 310A has a thickness that is selected to provide the desired threshold voltage $V_{th}$ for MOSFET 30. Thick oxide layer 316A has a thickness that can withstand the maximum drain-to-source breakdown voltage without rupture or damage.

Since the buried source electrodes 312A, 312B are tied to the N+ source region 322, the full source-to-drain voltage is seen across thick oxide layer 316A when MOSFET 30 is turned off. The doping concentration of N-drift region 314 is selected such that N-drift region 314 is fully depleted when the maximum drain-to-source voltage is reached, in the same manner as illustrated in FIG. 3.

FIGS. 7A-7H illustrate a process that may be used to fabricate MOSFET 30. The process begins by growing N-epi layer 202 on N+ substrate 200.

Figure 7A:
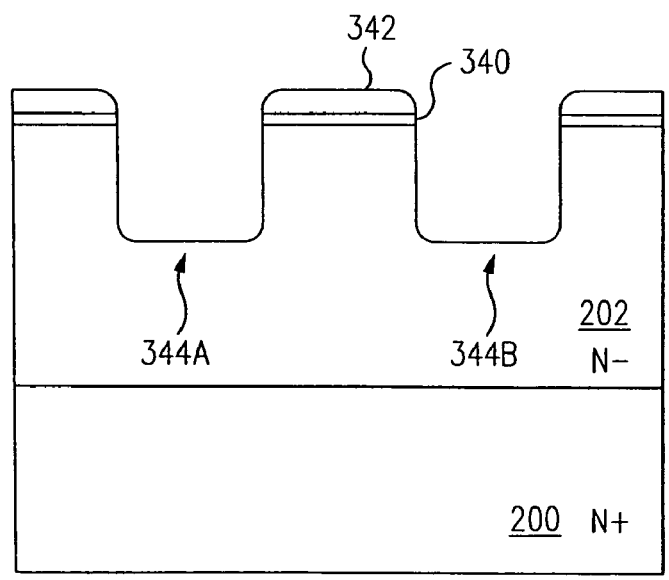
FIGS. 7A-7H illustrate steps of a process that can be used to fabricate the MOSFET shown in FIG. 6.

Next, as shown in FIG. 7A, a pad oxide layer 340 is thermally grown in the top surface of N-epi layer 202, and a silicon nitride layer 342 is deposited on oxide layer 340. Oxide layer 340 can have a thickness in the range of 250-300 Å and nitride layer 342 can have a thickness in the range of 2000-4000 Å. A photoresist mask layer (not shown) is formed over nitride layer 342, and nitride layer 342 and oxide layer 340 are then photolithographically patterned and etched to form two openings which expose the top surface of epi layer 202. Trenches 344A and 344B are formed by directionally etching epi layer 202 through the openings, preferably using an RIE process. Trenches 344A and 344B extend into epi layer 202 but not all the way to N+ substrate 200. Pad oxide layer 340 and nitride layer 342 can then be removed.

Figure 7B:
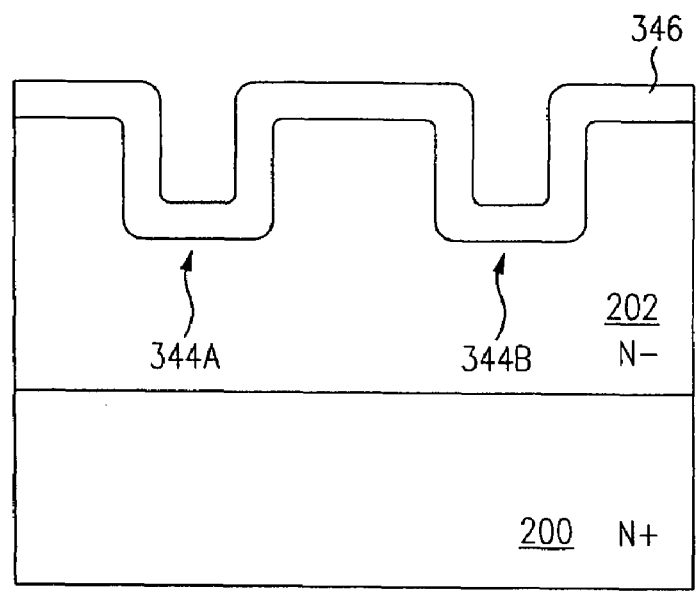

As shown in FIG. 7B, a second silicon nitride layer 346 is deposited over the top surface of N-epi layer 202, preferably by a chemical vapor deposition (CVD) process. As shown, nitride layer 346 conforms to the contours of the trenches 344A and 344B.

Figure 7C:
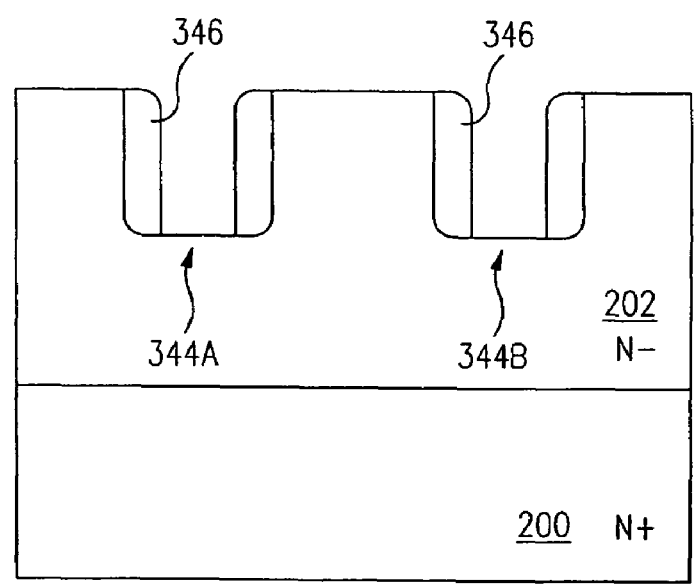

Next, as shown in FIG. 7C, nitride layer 346 is directionally etched, preferably by means of an RIE process. This process removes the horizontal portions of nitride layer 346, including the portions on the floor of trenches 344A and 344B, but leaves those portions of nitride layer 346 that are attached to the sidewalls of trenches 344A and 344B.

Figure 7D:
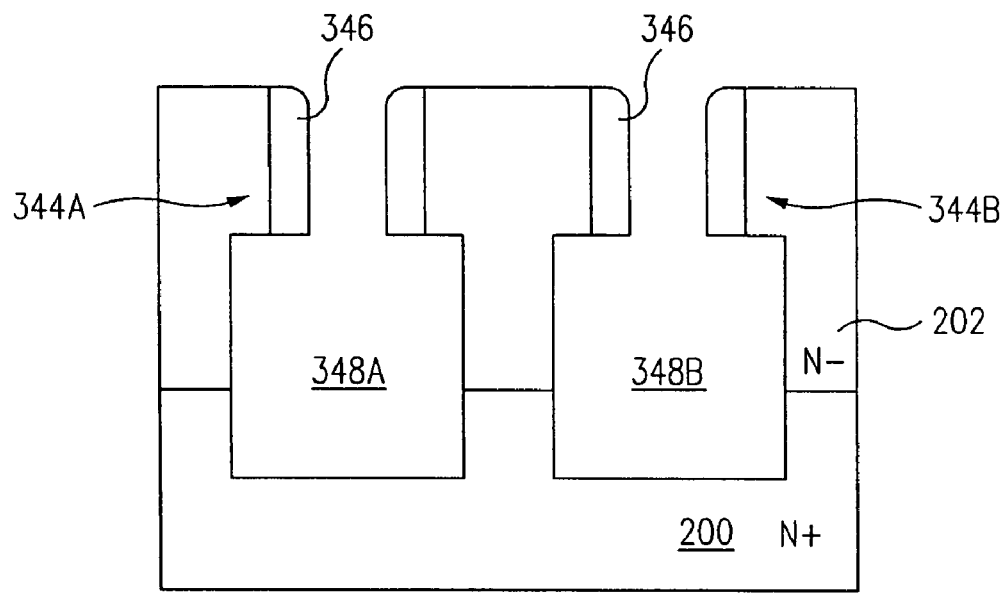

As shown in FIG. 7D, epi layer 202 is etched through the bottoms of trenches 344A and 344B to form cavities 348A and 348B, which in this embodiment extend downward to N+ substrate 200. Beforehand, a mask layer (not shown) is deposited and patterned to prevent the top surface of mesa 306 from being affected by a subsequent dry etch. Nitride layer 346 is unaffected by this etching process and remains attached to the walls of trenches 344A and 344B.

Figure 7E:
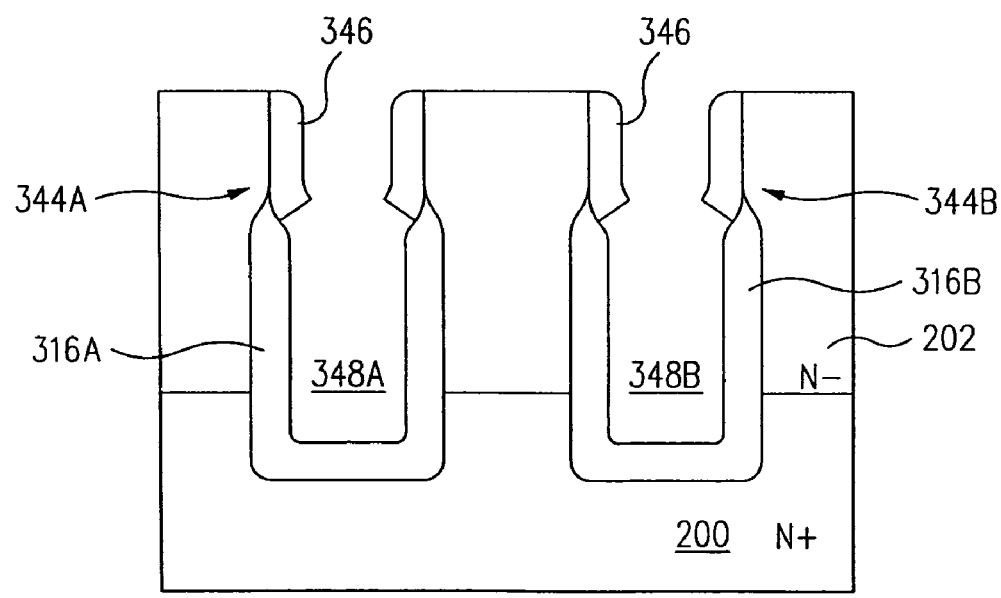
Figure 7F:
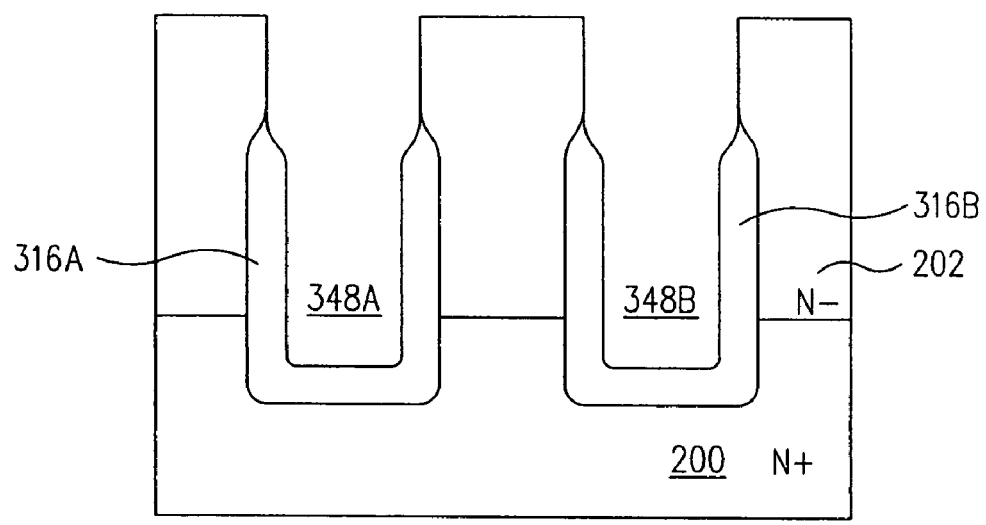

As shown in FIG. 7E, a thermal process is now used to form thick oxide layers 316A and 316B along the walls and floors of cavities 348A and 348B, respectively. Since nitride layers 346 are still in place, the familiar tapered "bird's beak" structure forms where the oxide undercuts the nitride. Nitride layers 346 are then removed, leaving the structure shown in FIG. 7F.

Figure 7G:
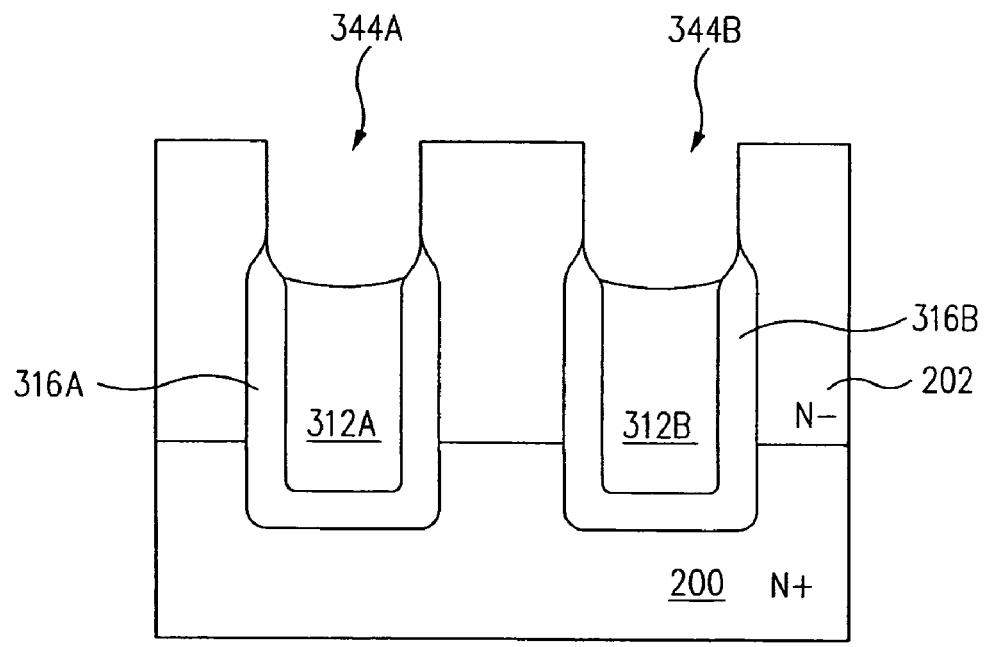

Cavities 348A and 348B and trenches 344A and 344B are then filled with polysilicon, and the polysilicon is etched back into trenches 344A and 344B, using a dry etch process. The doping concentration of the polysilicon can be on the order of $10^{20}$ cm$^{-3}$. Preferably, the surface of the polysilicon ends up just below the bird's beak portions of oxide layers 316A and 316B, where oxide layers 316A and 316B reach their full thickness. The result is the formation of polysilicon buried source electrodes 312A and 312B, which are electrically isolated from epi layer 202 by oxide layers 316A and 316B, as shown in FIG. 7G.

Figure 7H:
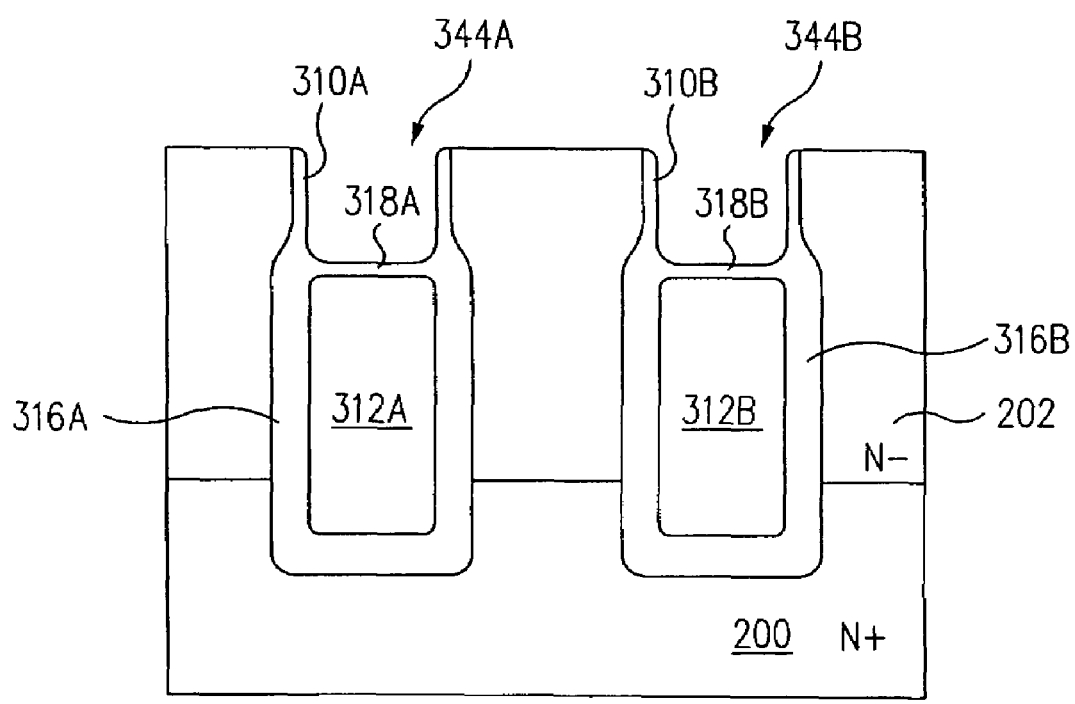

Next, as shown in FIG. 7H, gate oxide layers 310A and 310B are thermally grown on the sidewalls of trenches 344A and 344B. (Before this, a sacrificial oxide layer may be grown on and removed from the exposed sidewalls of the trenches 344A and 344B.). During the same thermal process that forms gate oxide layers 310A and 310B, thin oxide layers 318A and 318B are grown at 1050° C. on the top surface of buried source electrodes 312A and 312B. In the final series of steps, trenches 344A and 344B are filled with a second polysilicon layer, and the polysilicon is etched back to the mouths of trenches 344A and 344B, forming polysilicon gates 308A and 308B. As described above, P body regions 320, N+ source regions 322 and P+ regions 328 are implanted and diffused into epi layer 202 The upper surface of epi layer 202 is covered with BPSG layer 326 and BPSG layer 326 masked, patterned and etched so that segments of BPSG layer cover gates 308A and 308B and overlap a portion of N+ source regions 322. Metal layer 324 is then deposited, yielding MOSFET 30 shown in FIG. 6.

The buried source electrode can be contacted in a manner similar to that described above for MOSFET 20. In particular, the first polysilicon layer is etched back in two stages, and the surface of the first polysilicon layer is temporarily masked after the first etch stage at the locations where the buried source electrode is to be contacted. Later, openings are formed in BPSG layer 326 in these locations, so that source metal layer 324 abuts the polysilicon layer.

As described above, a photoresist layer (not shown) is formed over BPSG layer 226, and the photoresist layer is photolithographically patterned with openings over the locations where the source metal layer 224 is to contact the N+ source/P+ regions 222, 228 (as shown in FIG. 2) and over the locations where source metal layer 224 is to contact the polysilicon layer 248 (as shown in FIG. 5G). Source metal layer 224 is then deposited to form an electrical contact with N+ source/P+ regions 222, 228 and buried source electrodes 212A, 212B (via polysilicon layer 248). Similarly, in the embodiment shown in FIG. 6, BPSG layer 326 is patterned and etched with openings to allow source metal layer 324 to form an electrical contact with N+ source/P+ regions 322, 328 and buried source electrodes 312A, 312B.

BPSG layer 226 is also patterned with openings where the gates 208A, 208B are to be contacted, and a gate metal layer (not shown) is deposited in those openings to establish an electrical contact with gates 208A, 208B. Similarly, BPSG layer 326 is patterned with openings where gates 308A, 308B are to be contacted by a gate metal layer. Preferably, the gate metal layer is a part of a single metal layer that is deposited over the surface of the die and then etched to separate the source metal layer 224, 324 and the gate metal layer.

The trenches and mesas described above can be arranged in a variety of patterns on the surface of semiconductor die. One possible layout is shown in FIGS. 9A-9E, which shows an annular pattern of trenches and mesas in the top surface of a semiconductor die 50. Trenches 500, 504, 508 are in the form of square annuli or rings having rounded corners and are separated by mesas 502, 506, which are likewise in the form of square annuli or rings having rounded corners. The corners of trenches 500, 504, 508 and mesas 502, 506 are rounded to prevent the high electric fields that would occur if the corners were sharp right-angles. The trenches and mesas surround a central region 510, and an edge termination region 512 is located near the perimeter of die 50, outside the annular pattern of trenches and mesas.

It should be understood that for the sake of clarity the pattern of trenches and mesas is greatly enlarged in FIGS. 9A-9E. In reality, there would typically be thousands of trenches in the pattern. For example, die 50 might measure 2 mm×2 mm, and the trenches and mesas might be 1.5 µm wide. The cross-section 2-2 in FIG. 9A could be represented by FIG. 2, for example, with trenches 500 and 504 containing the elements of trenches 204A and 204B and mesa 502 having the structure of mesa 206 in FIG. 2.

Figure 12:
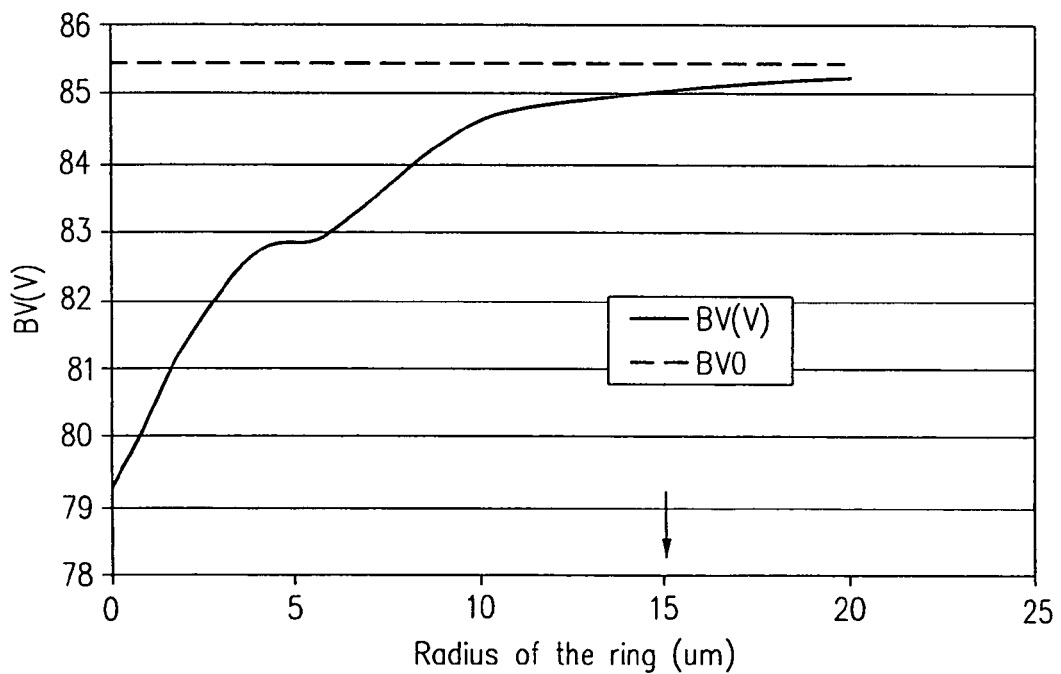
FIG. 12 is a graph generated by computer simulation showing the variation of breakdown voltage of a device as a function of the radius of curvature of the trench corners in an annular layout.
Figure 9A:
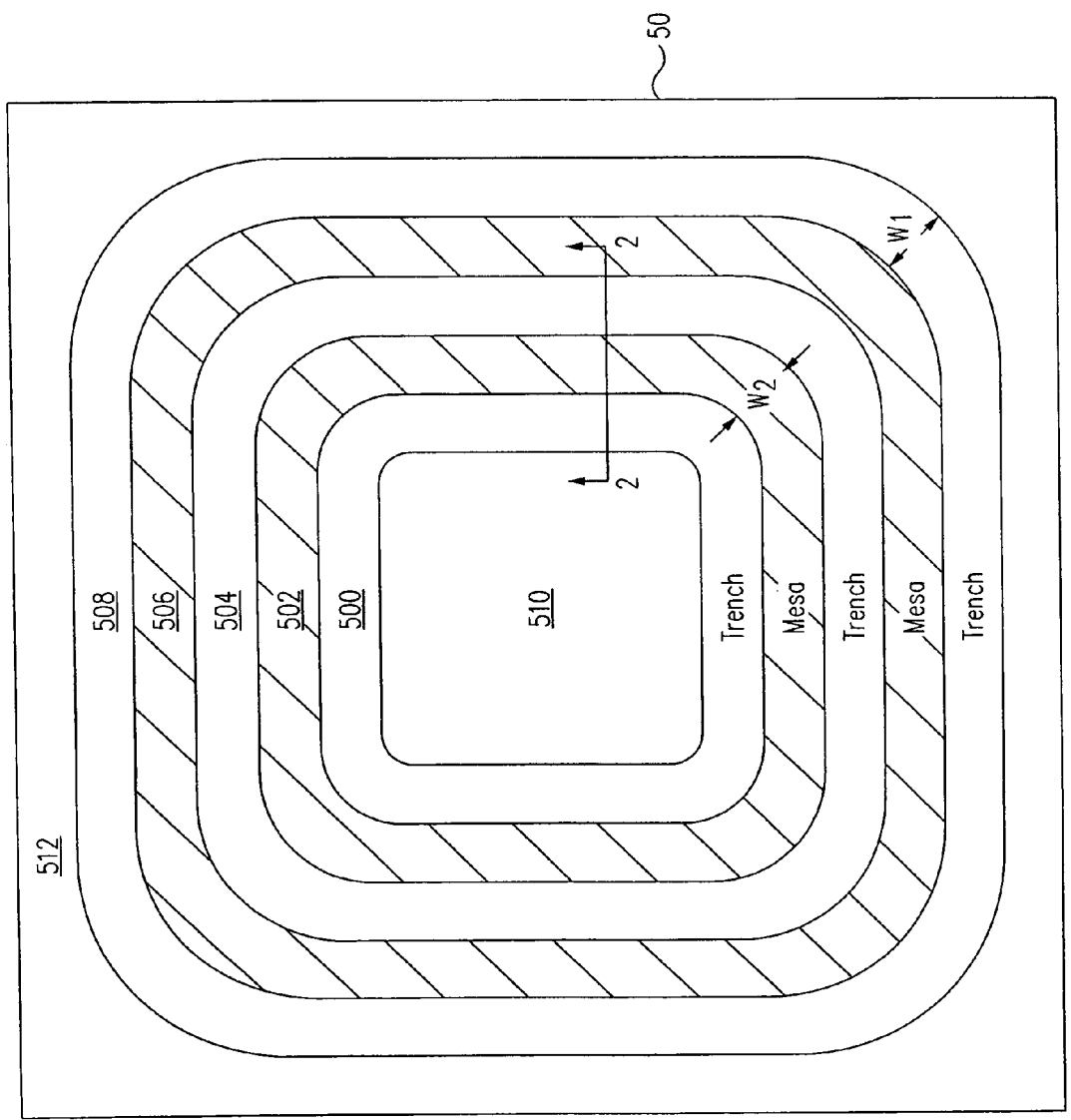
FIGS. 9A-9E illustrate the formation of source metal and gate metal layers over an annular arrangement of trenches in accordance with the invention.

In the particular embodiment illustrated in FIG. 9A, the width of mesas 502, 506 and trenches 500, 504, 508 is constant and the corners are rounded. FIG. 12 is a graph generated by computer simulation showing the breakdown voltage of a device (BV) as a function of the radius of curvature of the rounded trench corners. For example, at a radius of 15 µm, the breakdown voltage was about 85V.

Figure 9B:
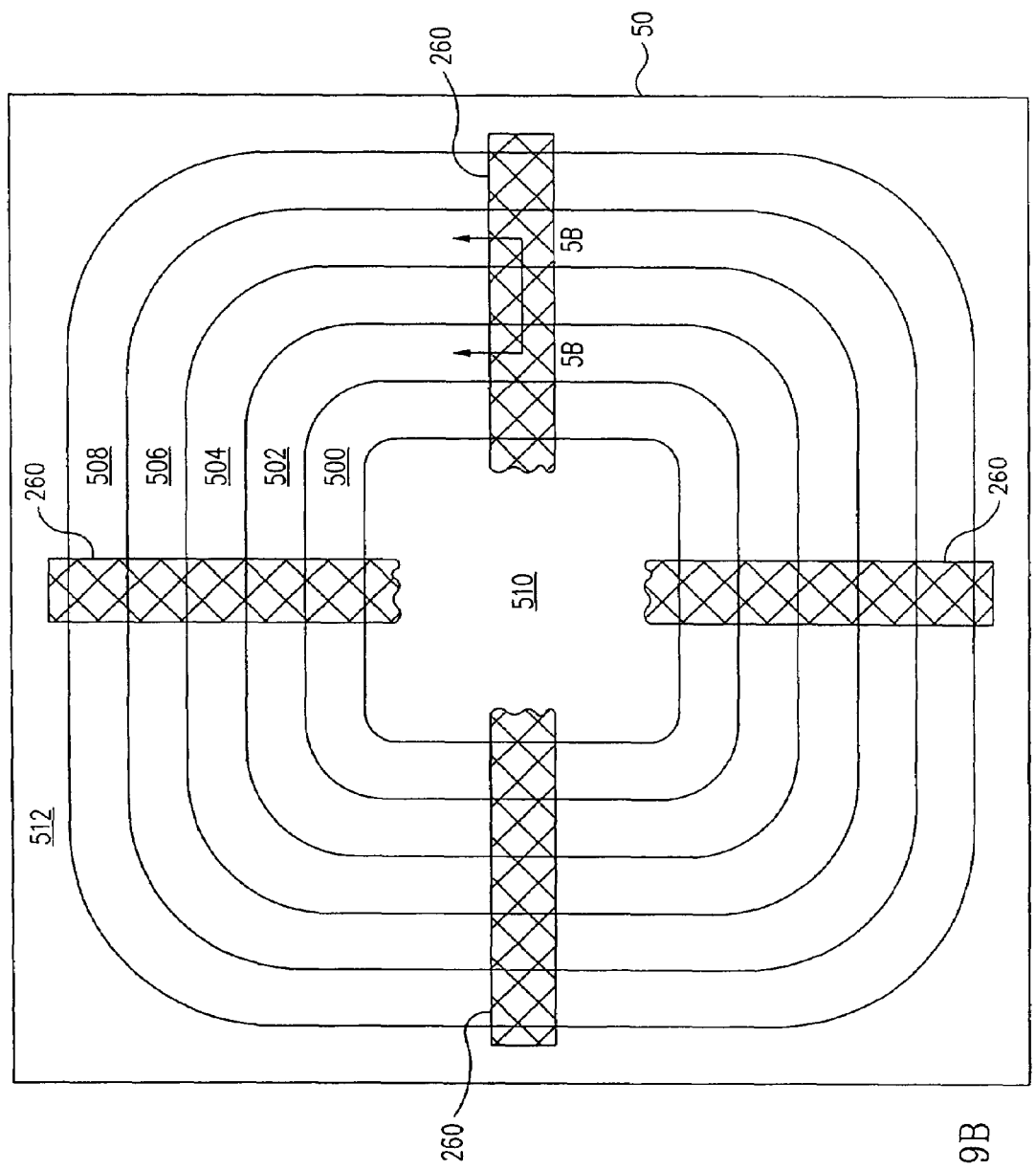
Figure 9C:
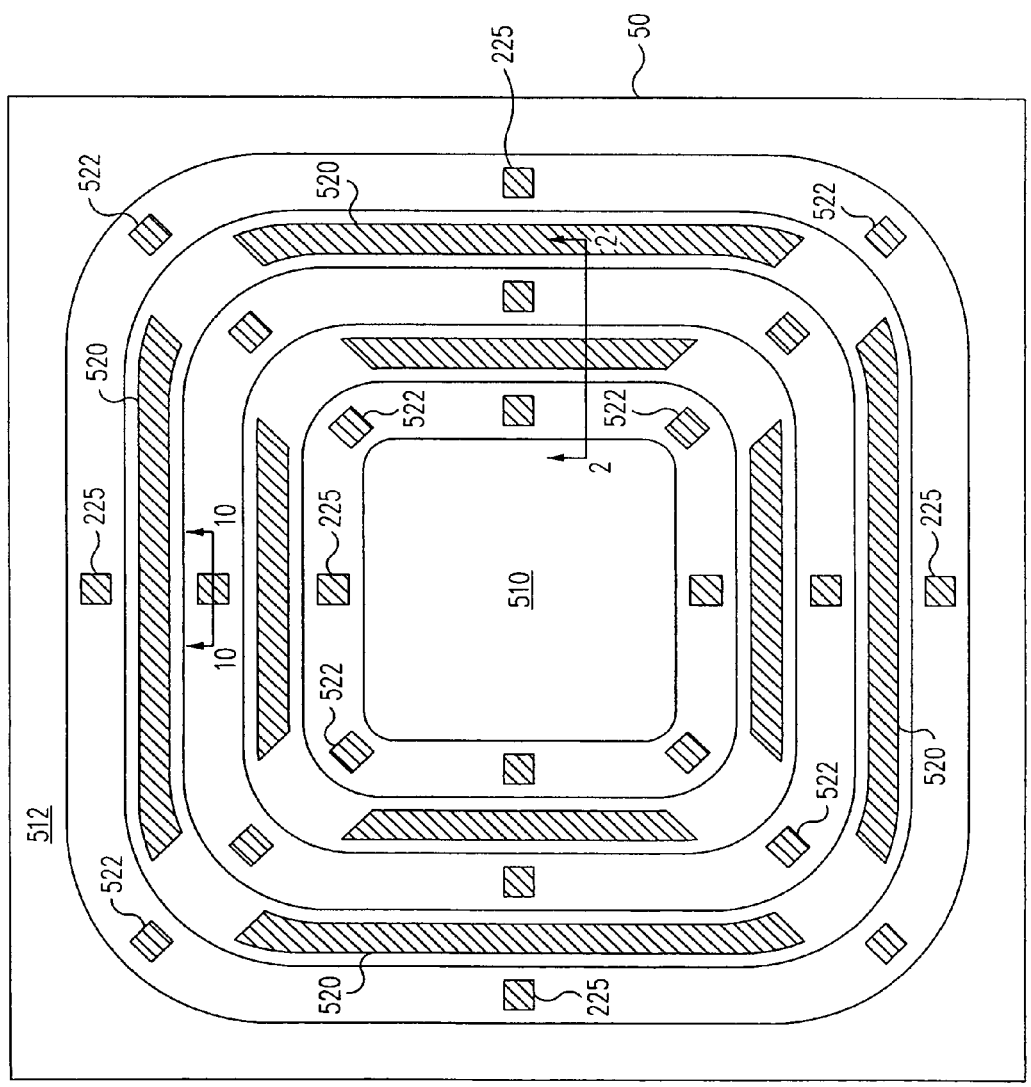

As explained above in connection with FIG. 5B, a photoresist layer 260 is deposited in the areas where contact is to be made to the buried source electrodes, after the gate polysilicon is etched back to the level of the surface of the epi layer 202 but before the gate polysilicon is etched back into the trench. FIG. 9B shows an illustrative layout of photoresist layer 260. Cross-section 5B-5B in FIG. 9B could be the cross-sectional view of FIG. 5B, for example, with photoresist layer 260 overlying the polysilicon layer 248. After photoresist layer 260 has been removed, and after oxide layer 254 and BPSG layer 226 are deposited and patterned, as shown in FIG. 5F, openings 225 are formed at the locations where the buried source electrode is to be contacted. A plurality of openings 225 are shown in FIG. 9C. FIG. 9C also shows openings 520 in BPSG layer 226, where metal contacts to the N+ source/P+ regions are made over mesas 502, 506, and openings 522 in BPSG layer 226, where metal contacts to the gate are made. In this embodiment, openings 522 extend outward along diagonal lines from the central region 510 to the corners of die 50.

Figure 10:
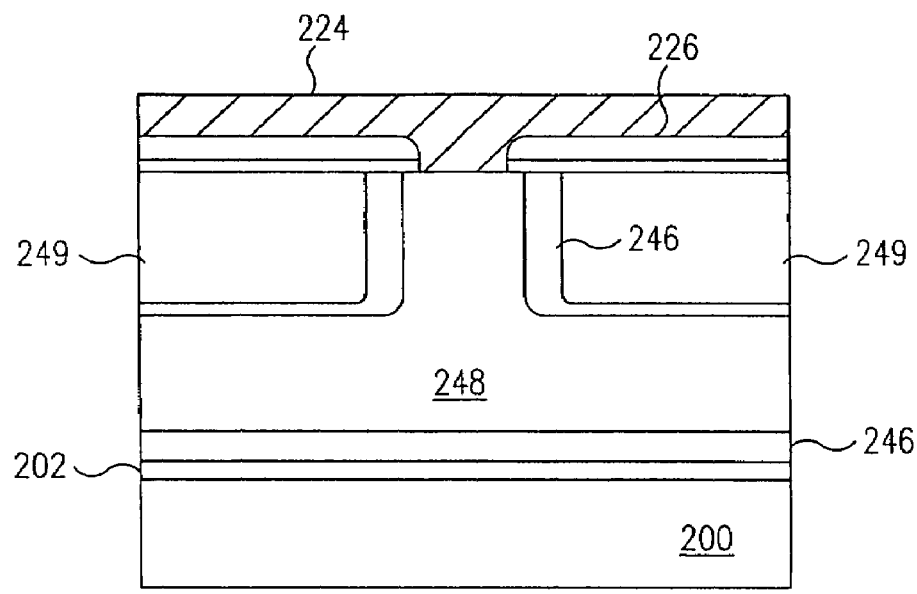
FIG. 10 shows a cross-section taken at section line 10-10 shown in FIG. 9C.

FIG. 10 shows the structure at cross-section 10-10 in FIG. 9C, with metal layer 224 in contact with buried polysilicon layer 248, which constitutes the buried source electrode and extends in both directions below the gate polysilicon 249.

Figure 9D:
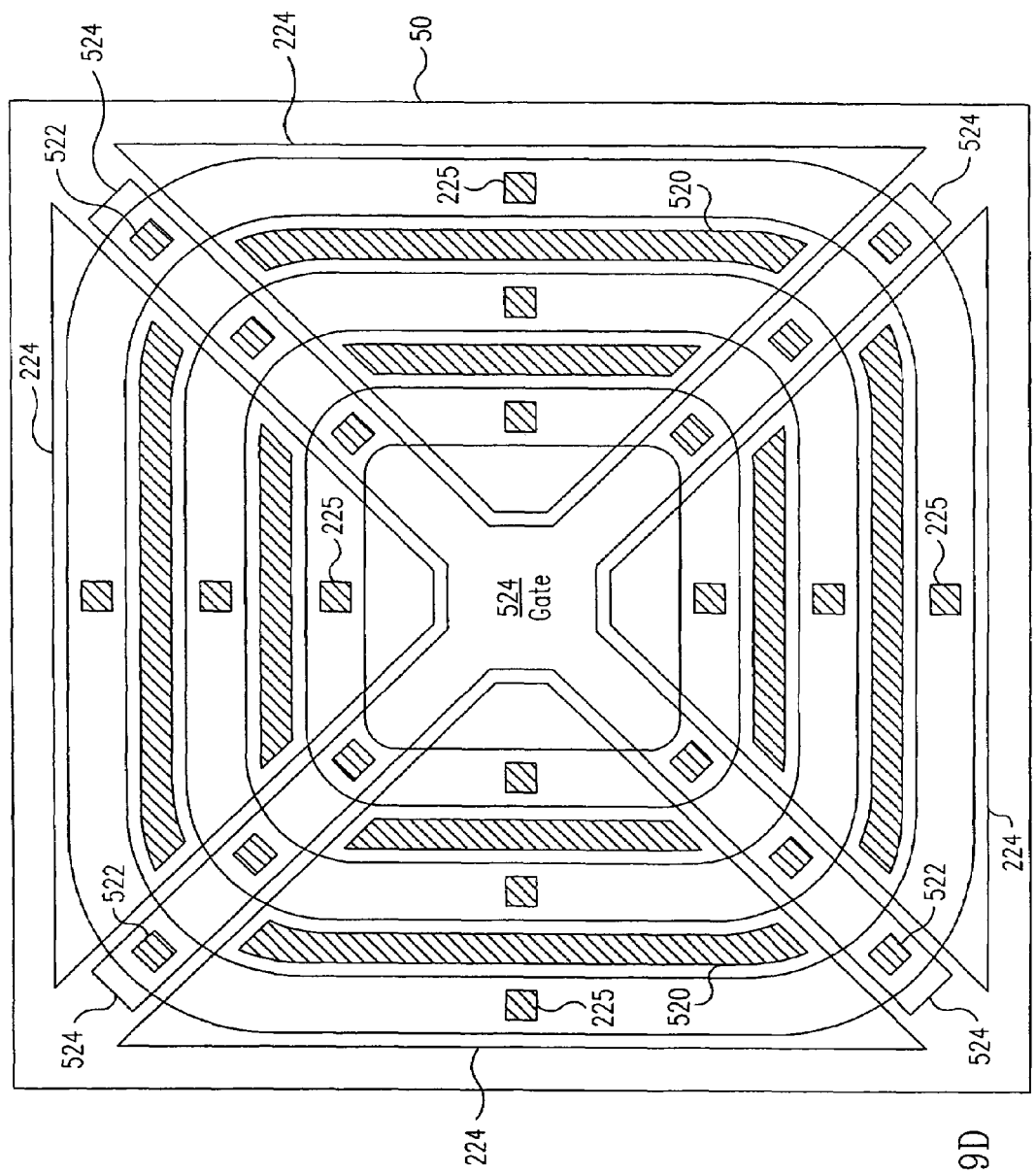
Figure 9E:
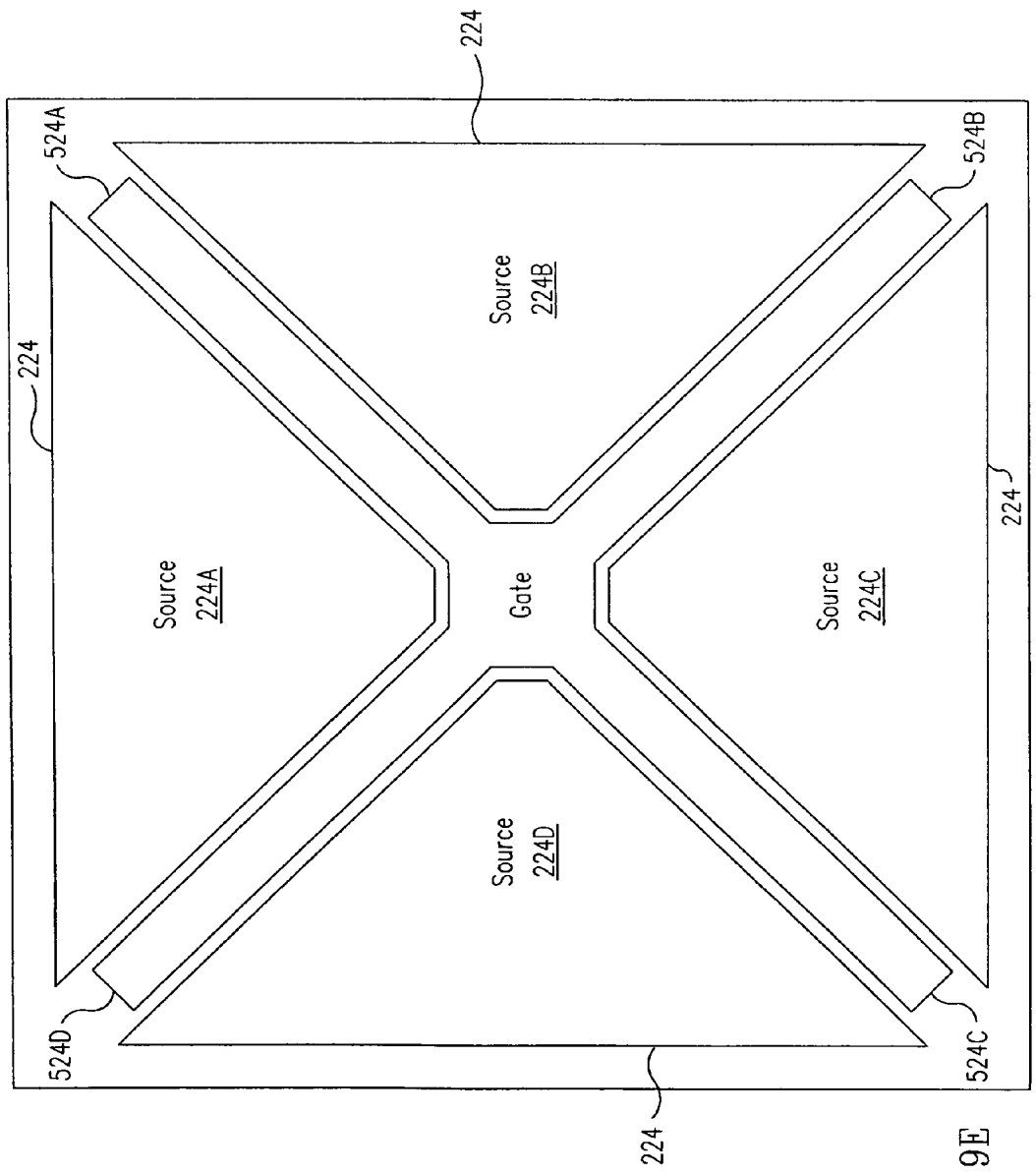

FIG. 9D shows source metal layer 224 superimposed over the openings 225, 520 and a gate metal layer 524 superimposed over the openings 522. Source metal layer 224 makes contact with the buried source electrodes via openings 225 and with the source/body regions via openings 520. Gate metal layer makes contact with the gate electrodes via the openings 522. FIG. 9E is a top view of source metal layer 224 and gate metal layer 524 in the finished device. It is evident that gate metal layer 524 includes four radial gate metal legs 524A-524D, each of which extends outward from the central region along a diagonal line and that the source metal layer 224 includes four sections 224A-224D that are located, respectively, in the regions between the legs of the gate metal legs 524A-524D.

Figure 11A:
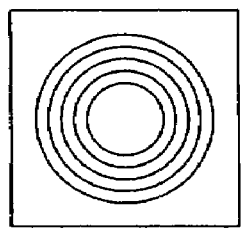
FIGS. 11A-11C illustrate alternative annular arrangements of trenches in accordance with the invention.
Figure 11B:
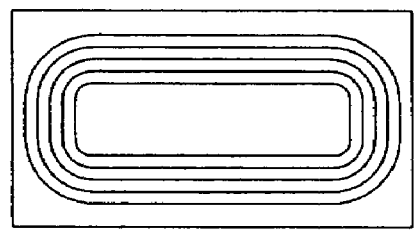
Figure 11C:
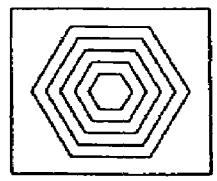

The invention is not limited to the particular geometric pattern shown in FIG. 9E. For example, the radial legs of the gate metal layer could extend outward along lines corresponding to the 12:00. 3:00, 6:00 and 9:00 positions instead of diagonal lines, and the source metal layer could be positioned in between the legs of the gate metal layer. Moreover, the pattern of the annular trenches and mesas could be circular, rectangular or hexagonal (or some other polygonal shape) as shown in FIGS. 11A-11C. When straight-line polygons are used, it will often be advantageous to round the corners to prevent unduly high electric fields from developing at the corners. The legs of the gate metal layer may extend outward at various radial intervals—e.g., 15°, 30°, 45°, 60° or 90°—depending on the geometry selected.

Figure 1:
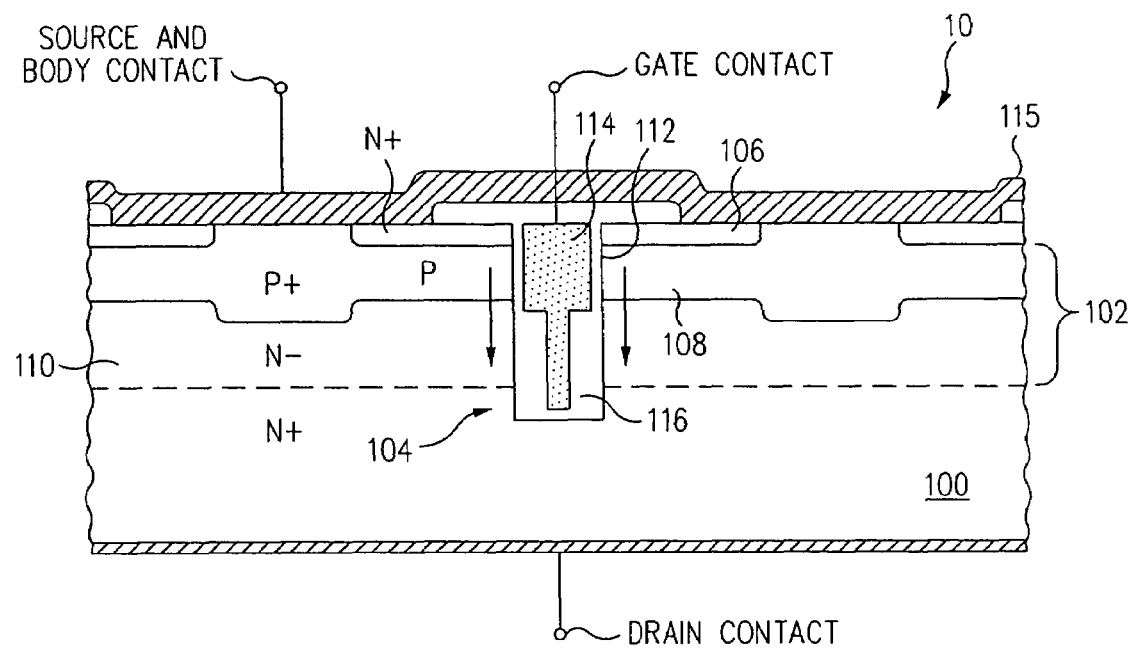
FIG. 1 is a cross-sectional view of a MOSFET that illustrates a known technique for reducing the gate-to-drain capacitance.

The annular layout patterns exemplified in FIGS. 9A-9E and FIGS. 11A-11C may also be used with conventional trench-gated devices such as the MOSFET illustrated in FIG. 1, wherein there would be no need for openings to connect the source metal layer to the buried source electrodes.

Figure 13A:
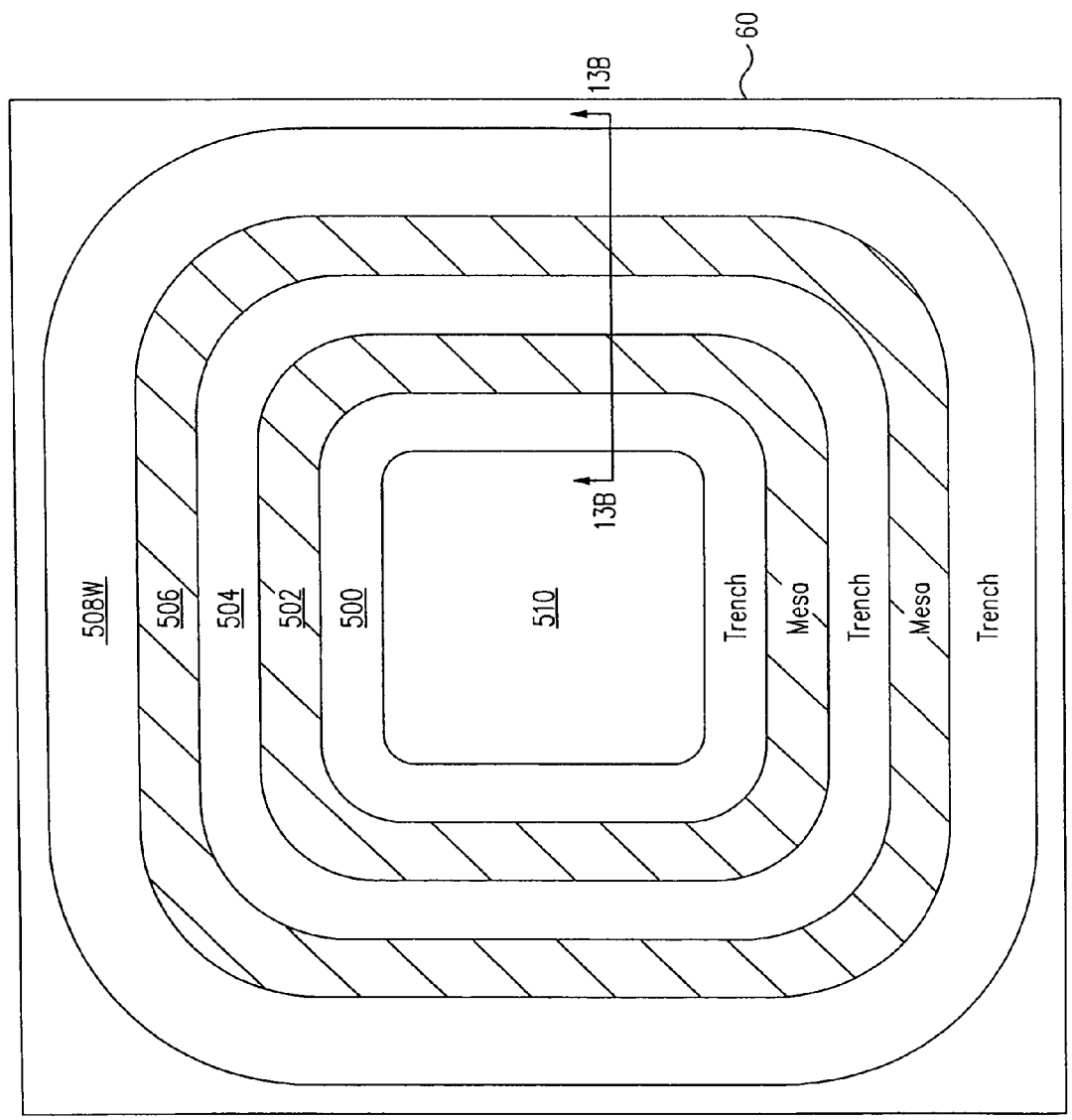
FIGS. 13A and 13B illustrate an annular arrangement of trenches similar to that shown in FIGS. 9A-9E but with a deeper peripheral trench which serves to "self-terminate" the device.
Figure 13B:
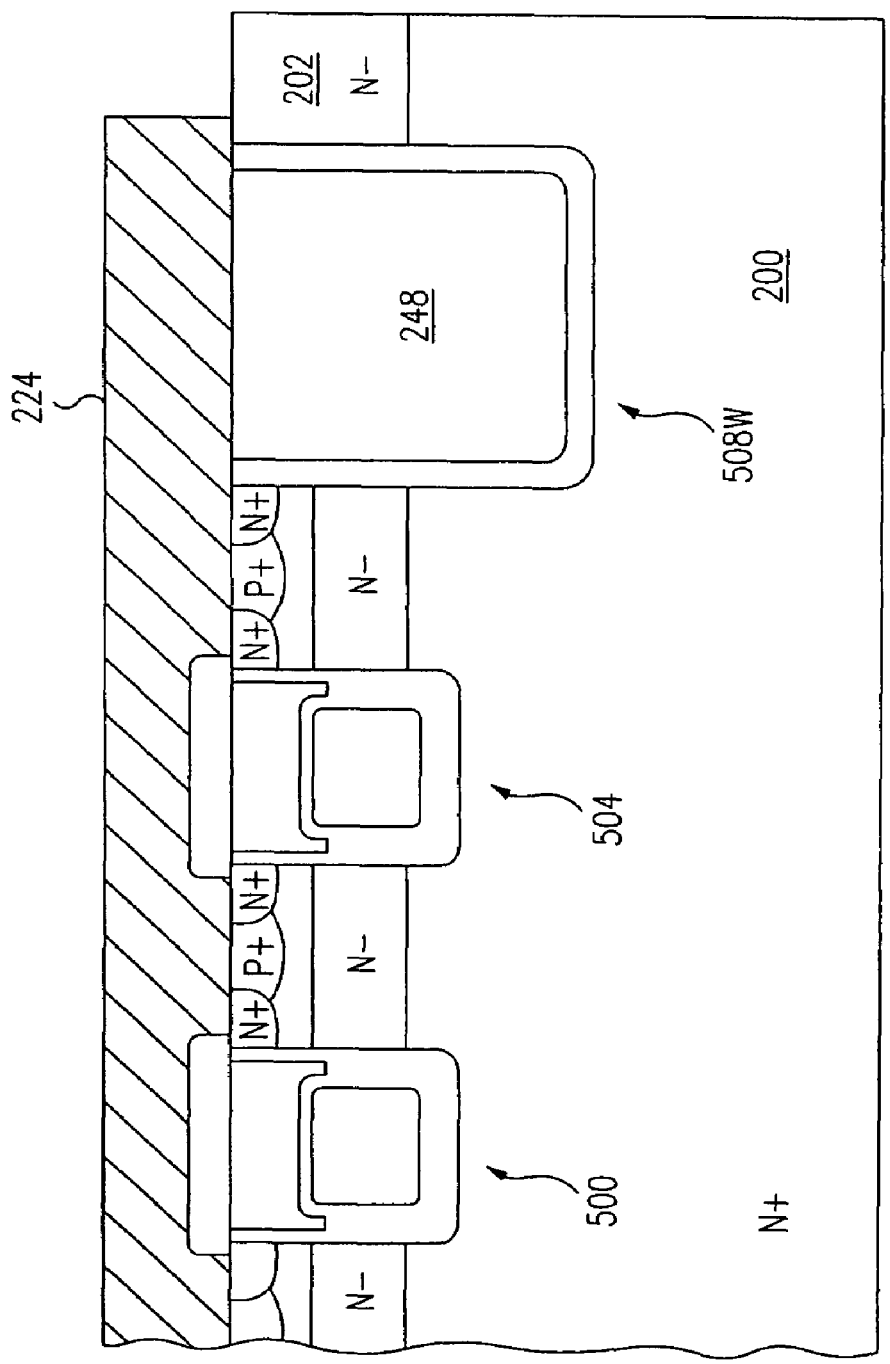

According to another aspect of the invention, the peripheral trench in the annular pattern shown in FIGS. 9A-9E can be made deeper than the trenches in the "active" regions of the device. This, in effect, makes the device "self-terminating." An example of this structure is shown in FIGS. 13A and 13B, where the peripheral trench 508 has been replaced by a trench 508W that is deeper than trenches 500 and 504. Preferably, to avoid the need for an additional masking step, trench 508W is also made wider than trenches 500 and 504. This is accomplished by making the opening in photoresist mask layer 242 (FIG. 4C) that is used to form trench 508W correspondingly wider than the openings that are used to form trenches 500 and 504. Therefore, in a normal etching process used to form the trenches 500, 540 and 508W, trench 508W will be etched deeper than trenches 500 and 504. Alternatively, a separate masking step can be used to form the deeper trench, in which case it may be the same width as trenches 500 and 504.

FIG. 13B is a cross-sectional view of trenches 500, 504 and 508W, showing that trench 508W is filled with polysilicon layer 248. Polysilicon layer 248 in trench 508W can be formed in the process sequence shown in FIGS. 5A-5C. Polysilicon layer 248 is contacted by source metal layer 224.

It will be understood that in other embodiments the termination area may include two or more deep trenches at the periphery of the chip, instead of just the single deep trench 508W shown in FIGS. 13A and 13B.

Figure 14:
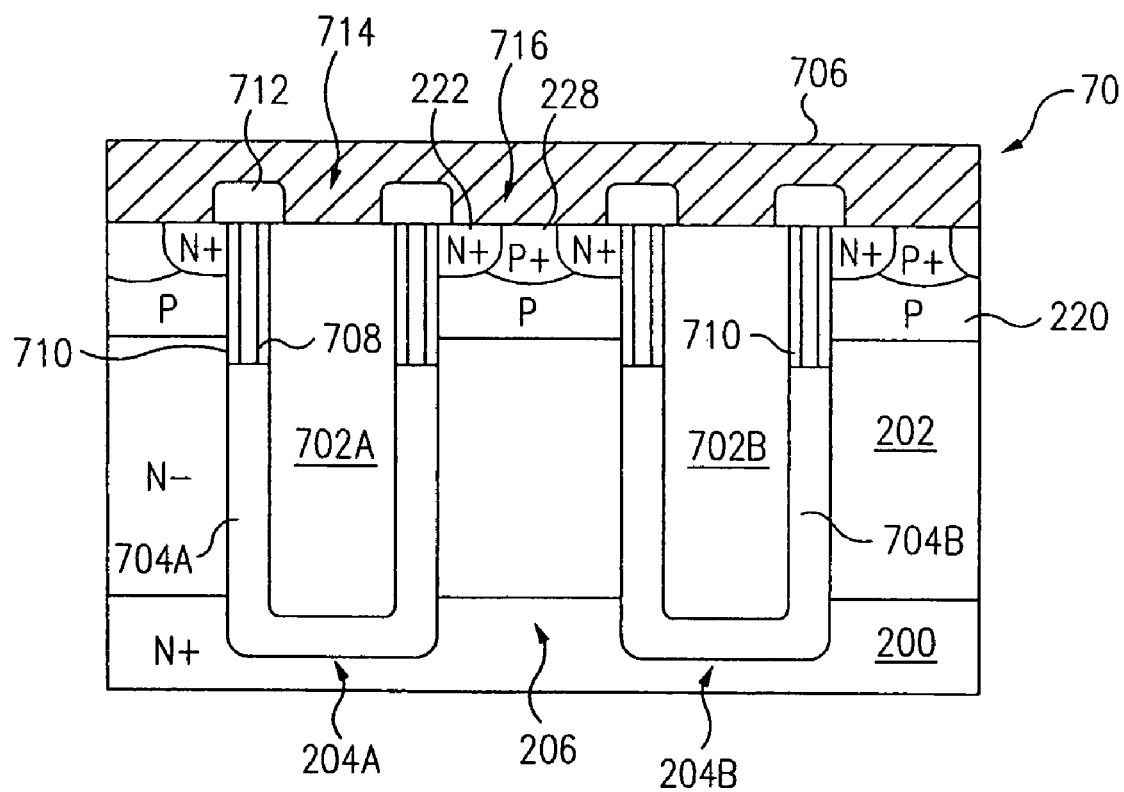
FIG. 14 is a cross-sectional view of another embodiment of a MOSFET in accordance with the invention.

FIG. 14 illustrates a cross-sectional view of an alternative embodiment according to the invention, in which the control gate is embedded in an oxide layer on the sides of the trench. MOSFET 70 contains many of the same components of MOSFET 20, shown in FIG. 2. In particular, N-epitaxial layer 202 is grown on N+ substrate 200, and trenches 204A and 204B extend through N-epitaxial layer 202 into N+ substrate 200. P body region 220, N+ source regions 222 and P+ body contact regions 228 are formed in N-epitaxial layer 202.

Trenches 204A and 204B contain source electrodes 702A and 702B, which extend upward to a source metal layer 706. The lower portions of source electrodes 702A and 702B are insulated from the N+ substrate 200 and N-epitaxial layer 202 by thick oxide layers 704A and 704B. Above thick oxide layers 704A and 704B are multilayer structures, each of which includes a control gate 708 embedded in a thin oxide layers 710. A first section of thin oxide layer 710 is in contact with epitaxial layer 202 and a second section of thin oxide layer 710 is in contact with the source electrode 702A or 702B. Each control gate 708 is sandwiched between the first and second sections of thin oxide layer 710 and is insulated from source metal layer 706 by oxide layer 712 at the surface of epitaxial layer 220. Source metal layer 706 contacts source electrodes 702A and 702B through openings 714 in oxide layer 712. Source metal layer 706 contacts N+ source regions 222 and P+ body contact regions 228 through openings 716 in oxide layer 712. As shown in FIG. 14, the multilayer structures comprising control gate 708 and oxide layers 710 may be approximately the same thickness as oxide layers 704A and 704B.

Figure 15:
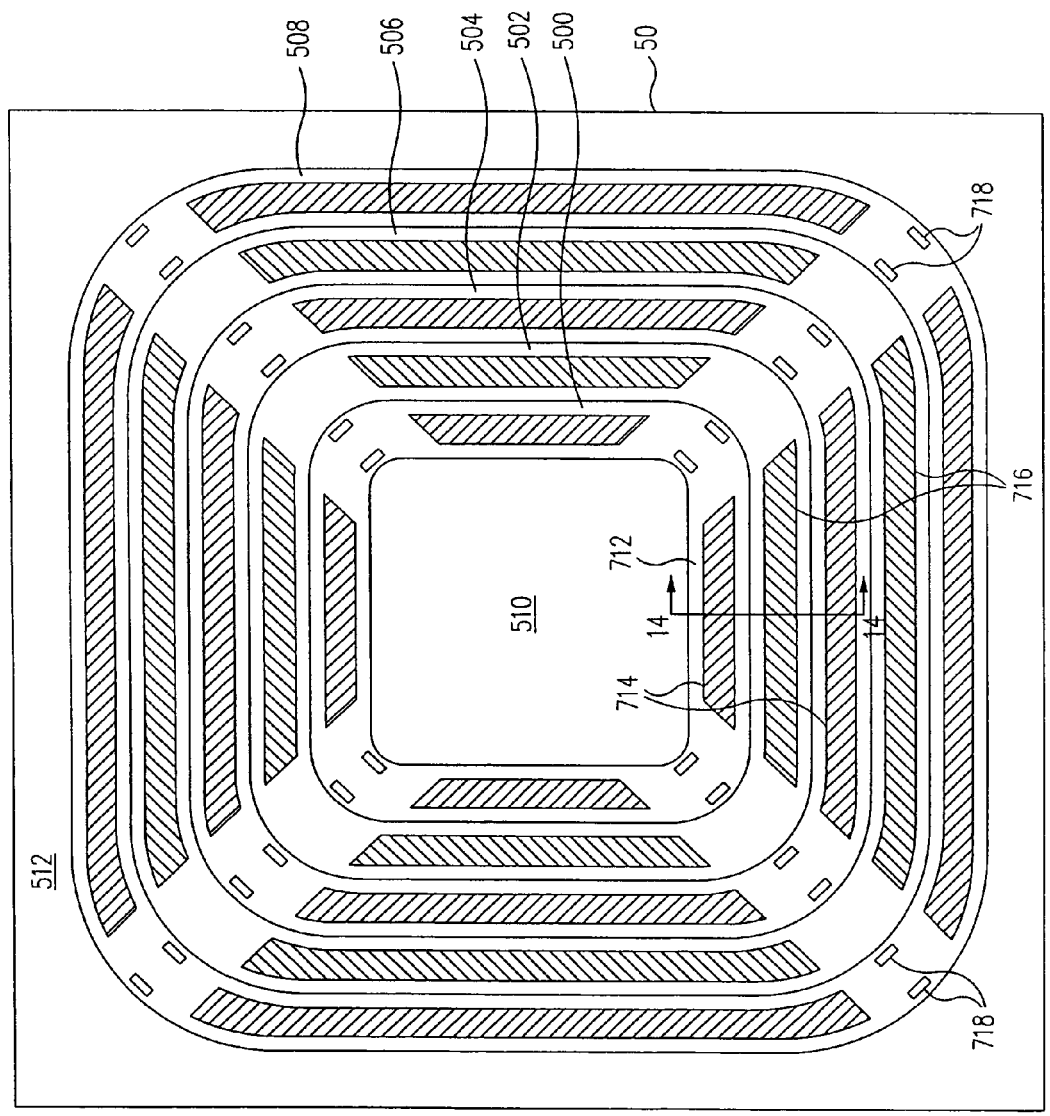
FIG. 15 is a top view of a layout which includes the MOSFET of FIG. 14.

FIG. 15 illustrates a layout of MOSFET 70, the cross-sectional view shown in FIG. 14 being designated 14-14. The annular pattern of trenches and mesas is similar to that shown in FIGS. 9A-9E. Openings 714 for contacting source electrodes 702A and 702B are shown, as are openings 716 for contacting N+ source regions 222 and P+ body contact regions 228. Source metal layer 224, shown in FIG. 9E, would contact source electrodes 702A and 702B, N+ source regions 222 and P+ body contact regions 228 through openings 714 and 716. Also shown in FIG. 15 are openings 718 in oxide layer 712, through which gate metal legs 524A-524D contact control gates 708.

Figure 16A:
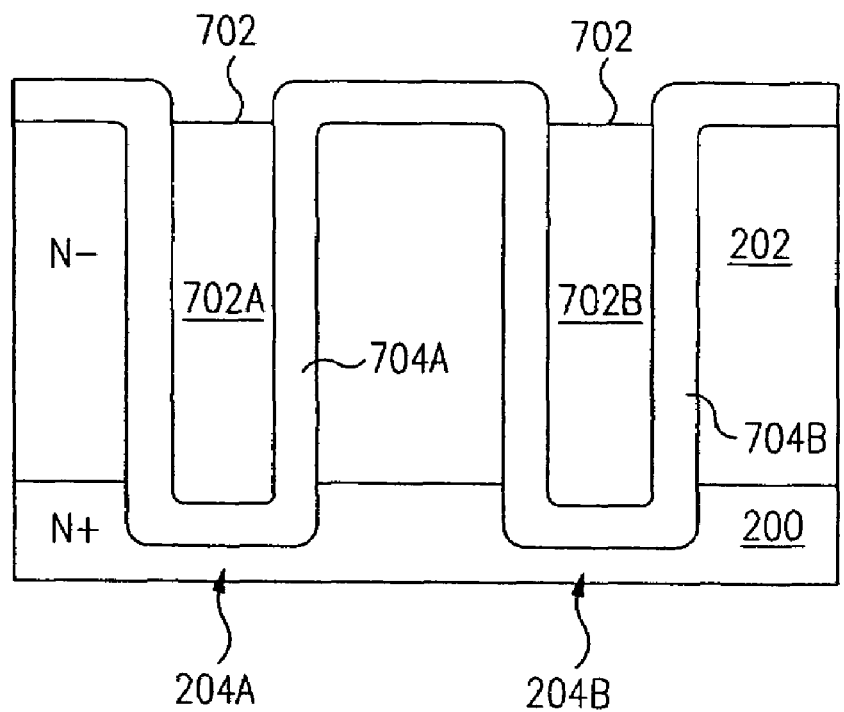
FIGS. 16A-16D illustrate a process for fabricating the MOSFET of FIG. 14.

FIGS. 16A-16D illustrate a process for fabricating MOSFET 70. FIG. 16A shows the structure at a stage similar to that shown in FIG. 5A, with thick oxide layers 704A and 704B on the walls and floor of trenches 204A and 204B, respectively, and polysilicon layer 702 etched back to the level of N-epitaxial layer 202.

Figure 16B:
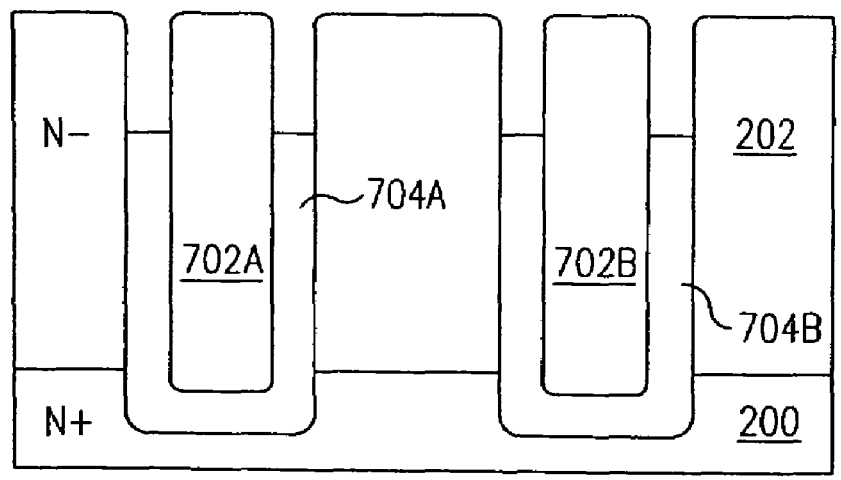
Figure 16C:
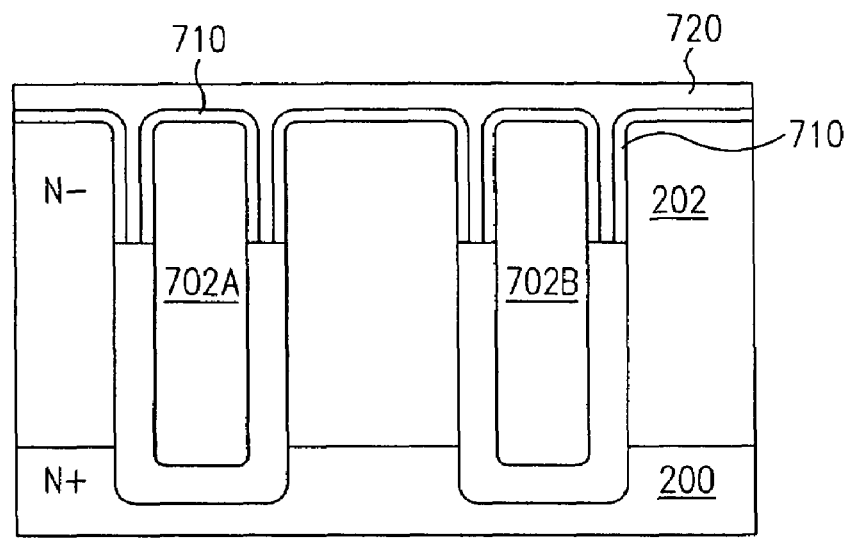

As shown in FIG. 16B, thick oxide layers 704A and 704B are etched a predetermined distance down into the trenches, using a BOE (buffer oxide etch) that attacks silicon dioxide in preference to polysilicon or epitaxial silicon. This forms cavities between source electrodes 702A and 702B, respectively, and epitaxial layer 202.

Next, a thin oxide layer 710 is thermally grown on the top surface of the structure. In each cavity, a first section of thin oxide layer 710 abuts a sidewall of the trench and a second section of thin oxide layer 710 abuts a sidewall of the source electrode. A second polysilicon layer 720 is deposited in the space between the first and second sections of thin oxide layer 710 in each cavity, leaving the structure shown in FIG. 16C.

Figure 16D:
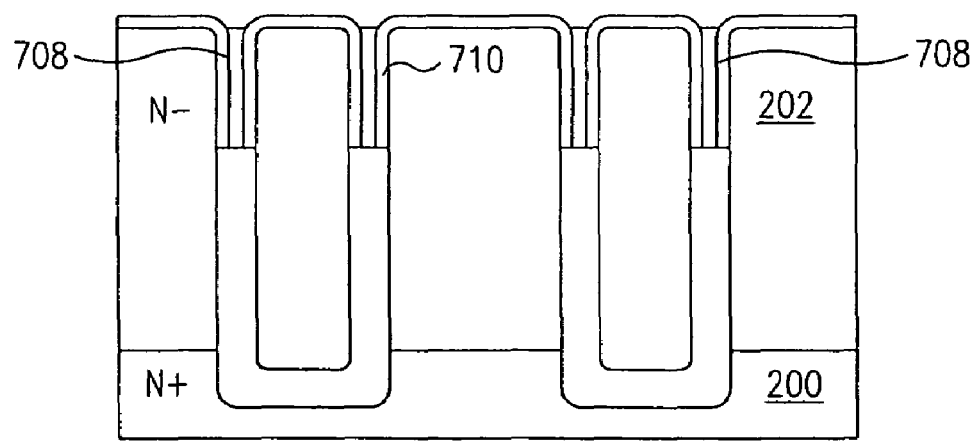

As shown in FIG. 16D, polysilicon layer 720 is etched back until its top surface is approximately level with the top surface of epitaxial layer 202 to form control gates 708. Next, referring to FIGS. 14 and 15, P body region 220, N+ source regions 222 and P+ body contact regions 228 are implanted and diffused as described above, and the portions of thin oxide layer 710 on the top surface of epitaxial layer 202 are then etched. Oxide layer 712 is deposited on the surface of epitaxial layer 202 and then masked and etched to form openings 714, 716 and 718 to source electrodes 702A and 702B, N+ source regions, and control gates 708, respectively. To complete the device, a metal layer is deposited and then patterned to form source metal layer 224 and gate metal legs 524, and the device may be covered with a passivation layer (not shown). This produces MOSFET 70, shown in FIG. 14. Note that in MOSFET 70 contact to the source electrodes 702A, 702B is made in every MOSFET cell.

It will be understood by those of skill in the art that the above-described embodiments are illustrative only, and not limiting. Many additional embodiments with the broad scope of this invention will be obvious from the description above.

The invention claimed is:

1. A trench-gate MOSFET comprising:
 a semiconductor substrate having first and second trenches formed at a first surface thereof, said first and second trenches forming a mesa therebetween, said mesa comprising:
  a source region of a first conductivity type located adjacent said first and second trenches at said first surface;
  a body region of a second conductivity type opposite to said first conductivity type adjacent said first and second trenches and forming a junction with said source region; and
  a drift region of said first conductivity type located adjacent said first and second trenches and forming a junction with said body region, wherein said drift region has a substantially uniform doping concentration Nconst in a central portion of said drift region;

a drain region of said first conductivity type adjacent a second surface of said substrate opposite to said first surface, said drain region having a doping concentration greater than Nconst; and a metal layer overlying said first surface of said substrate and being in electrical contact with said source region;

each of said first and second trenches comprising an upper portion comprising a gate electrode, said gate electrode being separated from said body region by a gate oxide layer; and a lower portion comprising a buried source electrode, said buried source electrode being electrically isolated from said drift region by a second oxide layer and from said gate electrode by a third oxide layer, said buried source electrode being electrically connected to said source region;

wherein a width of said mesa, a width of said trench, and said doping concentration Nconst in said drift region are established such that said drift region is fully depleted at a drain-to-source voltage equal to Vds but is not fully depleted at a drain-to-source voltage of less than Vds;

wherein a thickness of said second oxide layer in cm is approximately equal to $10^{-7}$ times said voltage Vds in volts; and wherein Vds equals 200 volts, Nconst equals $7.5 \times 10^{16}$ cm$^{-3}$, said mesa width equals 3.1 μm, said trench width equals 3.4 μm, and said thickness of said second oxide layer equals 1.6 μm.

2. A trench-gate MOSFET comprising:

a semiconductor substrate having first and second trenches formed at a first surface thereof, said first and second trenches forming a mesa therebetween, said mesa comprising:

a source region of a first conductivity type located adjacent said first and second trenches at said first surface;

a body region of a second conductivity type opposite to said first conductivity type adjacent said first and second trenches and forming a junction with said source region; and a drift region of said first conductivity type located adjacent said first and second trenches and forming a junction with said body region, wherein said drift region has a substantially uniform doping concentration Nconst in a central portion of said drift region;

a drain region of said first conductivity type adjacent a second surface of said substrate opposite to said first surface, said drain region having a doping concentration greater than Nconst; and a metal layer overlying said first surface of said substrate and being in electrical contact with said source region;

each of said first and second trenches comprising an upper portion comprising a gate electrode, said gate electrode being separated from said body region by a gate oxide layer; and a lower portion comprising a buried source electrode, said buried source electrode being electrically isolated from said drift region by a second oxide layer and from said gate electrode by a third oxide layer, said buried source electrode being electrically connected to said source region;

wherein a width of said mesa, a width of said trench, and said doping concentration Nconst in said drift region are established such that said drift region is fully depleted at a drain-to-source voltage equal to Vds but is not fully depleted at a drain-to-source voltage of less than Vds;

wherein a thickness of said second oxide layer in cm is approximately equal to $10^{-7}$ times said voltage Vds in volts; and wherein Vds equals 250 volts, Nconst equals $4.5 \times 10^{15}$ cm$^{-3}$, said mesa width equals 4.4 μm, said trench width equals 4.6 μm, and said thickness of said second oxide layer equals 2.2 μm.

* * * * *